United States Patent
Lin et al.

(10) Patent No.: US 9,640,396 B2
(45) Date of Patent: May 2, 2017

(54) SPIN-ON SPACER MATERIALS FOR DOUBLE- AND TRIPLE-PATTERNING LITHOGRAPHY

(75) Inventors: Qin Lin, Rolla, MO (US); Rama Puligadda, Rolla, MO (US); James Claypool, Rolla, MO (US); Douglas J. Guerrero, Rolla, MO (US); Brian Smith, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 1590 days.

(21) Appl. No.: 12/652,464

(22) Filed: Jan. 5, 2010

(65) Prior Publication Data

US 2010/0170868 A1 Jul. 8, 2010

Related U.S. Application Data

(60) Provisional application No. 61/143,013, filed on Jan. 7, 2009.

(51) Int. Cl.
*H01L 21/308* (2006.01)
*B31D 3/00* (2006.01)
(Continued)

(52) U.S. Cl.
CPC .......... *H01L 21/0337* (2013.01); *C08G 77/20* (2013.01); *G03F 7/40* (2013.01); *H01L 21/0338* (2013.01); *H01L 21/3121* (2013.01)

(58) Field of Classification Search
CPC ................................................ H01L 21/3086
(Continued)

(56) References Cited

U.S. PATENT DOCUMENTS 3,345,210 A 10/1967 Wilson
3,561,962 A 2/1971 Ewing
(Continued)

FOREIGN PATENT DOCUMENTS

EP 0 160 248 11/1985
EP 1 033 624 6/2000
(Continued)

OTHER PUBLICATIONS

Office action dated Mar. 3, 2010 in related case 11839317 filed Aug. 15, 2007.

(Continued)

*Primary Examiner* — Thomas Pham
(74) *Attorney, Agent, or Firm* — Hovey Williams LLP

(57) ABSTRACT

Novel double- and triple-patterning methods are provided. The methods involve applying a shrinkable composition to a patterned template structure (e.g., a structure having lines) and heating the composition. The shrinkable composition is selected to possess properties that will cause it to shrink during heating, thus forming a conformal layer over the patterned template structure. The layer is then etched to leave behind pre-spacer structures, which comprise the features from the pattern with remnants of the shrinkable composition adjacent the feature sidewalls. The features are removed, leaving behind a doubled pattern. In an alternative embodiment, an extra etch step can be carried out prior to formation of the features on the template structure, thus allowing the pattern to be tripled rather than doubled.

19 Claims, 13 Drawing Sheets

(51) Int. Cl.
*H01L 21/311* (2006.01)
*H01L 21/033* (2006.01)
*C08G 77/20* (2006.01)
*G03F 7/40* (2006.01)
*H01L 21/312* (2006.01)

(58) Field of Classification Search
USPC .................................. 216/30, 46; 438/696
See application file for complete search history.

(56) References Cited

U.S. PATENT DOCUMENTS

| | | | |
|---|---|---|---|
| 3,615,615 | A | 10/1971 | Lincoln et al. |
| 3,629,036 | A | 12/1971 | Isaacson |
| 3,682,641 | A | 8/1972 | Casler et al. |
| 3,833,374 | A | 9/1974 | Patrick |
| 3,856,751 | A | 12/1974 | Wilson |
| 3,873,361 | A | 3/1975 | Franco et al. |
| 3,894,163 | A | 7/1975 | Broyde |
| 3,976,524 | A | 8/1976 | Feng |
| 4,137,365 | A | 1/1979 | Wydeven et al. |
| 4,175,175 | A | 11/1979 | Johnson et al. |
| 4,244,799 | A | 1/1981 | Fraser et al. |
| 4,320,224 | A | 3/1982 | Rose et al. |
| 4,346,163 | A | 8/1982 | Takeyama et al. |
| 4,369,090 | A | 1/1983 | Wilson et al. |
| 4,397,722 | A | 8/1983 | Haller |
| 4,430,419 | A | 2/1984 | Harada |
| 4,526,856 | A | 7/1985 | Lewis et al. |
| 4,568,631 | A | 2/1986 | Badami et al. |
| 4,578,328 | A | 3/1986 | Kray |
| 4,647,517 | A | 3/1987 | Hersener et al. |
| 4,683,024 | A | 7/1987 | Miller et al. |
| 4,732,841 | A | 3/1988 | Radigan |
| 4,738,916 | A | 4/1988 | Namatsu et al. |
| 4,742,152 | A | 5/1988 | Scola |
| 4,803,147 | A | 2/1989 | Mueller et al. |
| 4,808,513 | A | 2/1989 | Lazarus et al. |
| 4,845,265 | A | 7/1989 | Lapin et al. |
| 4,891,303 | A | 1/1990 | Garza et al. |
| 4,910,122 | A | 3/1990 | Arnold et al. |
| 4,927,736 | A | 5/1990 | Mueller et al. |
| 4,996,247 | A | 2/1991 | Nelson et al. |
| 5,057,399 | A | 10/1991 | Flaim et al. |
| 5,066,566 | A | 11/1991 | Novembre |
| 5,089,593 | A | 2/1992 | Fjare et al. |
| 5,091,047 | A | 2/1992 | Cleeves et al. |
| 5,106,718 | A | 4/1992 | Bartmann et al. |
| 5,126,231 | A | 6/1992 | Levy |
| 5,132,774 | A * | 7/1992 | Matsuura et al. ............ 257/758 |
| 5,137,780 | A | 8/1992 | Nichols et al. |
| 5,169,494 | A | 12/1992 | Hashimoto et al. |
| 5,198,153 | A | 3/1993 | Angelopoulos et al. |
| 5,246,782 | A | 9/1993 | Kennedy et al. |
| 5,302,548 | A | 4/1994 | Watanabe et al. |
| 5,304,626 | A | 4/1994 | Burgess et al. |
| 5,336,925 | A | 8/1994 | Moss et al. |
| 5,340,684 | A | 8/1994 | Hayase et al. |
| 5,370,969 | A | 12/1994 | Vidusek |
| 5,397,684 | A | 3/1995 | Hogan et al. |
| 5,403,438 | A | 4/1995 | Motoyama |
| 5,443,941 | A | 8/1995 | Bariya et al. |
| 5,542,971 | A | 8/1996 | Auslander et al. |
| 5,545,588 | A | 8/1996 | Yoo |
| 5,554,473 | A | 9/1996 | Cais et al. |
| 5,607,824 | A | 3/1997 | Fahey et al. |
| 5,632,910 | A | 5/1997 | Nagayama et al. |
| 5,633,210 | A | 5/1997 | Yang et al. |
| 5,667,940 | A | 9/1997 | Hsue et al. |
| 5,688,987 | A | 11/1997 | Meador et al. |
| 5,691,101 | A | 11/1997 | Ushirogouchi et al. |
| 5,739,254 | A | 4/1998 | Fuller et al. |
| 5,772,925 | A | 6/1998 | Watanabe et al. |
| 5,807,790 | A | 9/1998 | Gupta et al. |
| 5,892,096 | A | 4/1999 | Meador et al. |
| 5,922,503 | A | 7/1999 | Spak et al. |
| 5,925,578 | A | 7/1999 | Bae |
| 5,939,235 | A | 8/1999 | Kondo et al. |
| 5,952,448 | A | 9/1999 | Lee et al. |
| 5,968,324 | A | 10/1999 | Cheung et al. |
| 5,972,560 | A | 10/1999 | Kaneko et al. |
| 5,998,569 | A | 12/1999 | Hogan et al. |
| 6,015,650 | A | 1/2000 | Bae |
| 6,020,269 | A | 2/2000 | Wang et al. |
| 6,042,997 | A | 3/2000 | Barclay et al. |
| 6,046,112 | A | 4/2000 | Wang |
| 6,054,254 | A | 4/2000 | Sato et al. |
| 6,063,547 | A | 5/2000 | Ye et al. |
| 6,071,662 | A | 6/2000 | Carmichael et al. |
| 6,103,456 | A | 8/2000 | Tobben et al. |
| 6,110,653 | A | 8/2000 | Holmes et al. |
| 6,121,098 | A | 9/2000 | Strobl |
| 6,124,077 | A | 9/2000 | Imai et al. |
| 6,127,070 | A | 10/2000 | Yang et al. |
| 6,136,511 | A | 10/2000 | Reinberg et al. |
| 6,136,679 | A | 10/2000 | Yu et al. |
| 6,156,658 | A | 12/2000 | Wang et al. |
| 6,156,665 | A | 12/2000 | Hamm et al. |
| 6,162,580 | A | 12/2000 | Matsuoka et al. |
| 6,165,695 | A | 12/2000 | Yang et al. |
| 6,171,763 | B1 | 1/2001 | Wang et al. |
| 6,187,509 | B1 | 2/2001 | Imai et al. |
| 6,200,907 | B1 | 3/2001 | Wang et al. |
| 6,207,238 | B1 | 3/2001 | Affinito |
| 6,218,292 | B1 | 4/2001 | Foote |
| 6,232,386 | B1 | 5/2001 | Vargo et al. |
| 6,251,562 | B1 | 6/2001 | Breyta et al. |
| 6,268,108 | B1 | 7/2001 | Iguchi et al. |
| 6,268,282 | B1 | 7/2001 | Sandhu et al. |
| 6,291,145 | B1 | 9/2001 | Kokubo et al. |
| 6,306,560 | B1 | 10/2001 | Wang et al. |
| 6,309,789 | B1 | 10/2001 | Takano et al. |
| 6,309,926 | B1 | 10/2001 | Bell et al. |
| 6,309,955 | B1 | 10/2001 | Subramanian et al. |
| 6,316,165 | B1 | 11/2001 | Pavelchek et al. |
| 6,319,649 | B1 | 11/2001 | Kato et al. |
| 6,319,651 | B1 | 11/2001 | Holmes et al. |
| 6,338,936 | B1 | 1/2002 | Ichikawa et al. |
| 6,359,028 | B1 | 3/2002 | Miya et al. |
| 6,361,833 | B1 | 3/2002 | Nakada et al. |
| 6,380,611 | B1 | 4/2002 | Yin et al. |
| 6,383,952 | B1 | 5/2002 | Subramanian et al. |
| 6,391,472 | B1 | 5/2002 | Lamb |
| 6,410,209 | B1 | 6/2002 | Adams et al. |
| 6,426,125 | B1 | 7/2002 | Yang et al. |
| 6,428,894 | B1 | 8/2002 | Babich et al. |
| 6,440,640 | B1 | 8/2002 | Yang et al. |
| 6,451,498 | B1 | 9/2002 | Pirri et al. |
| 6,455,416 | B1 | 9/2002 | Subramanian et al. |
| 6,458,509 | B1 | 10/2002 | Haruta |
| 6,458,705 | B1 | 10/2002 | Hung et al. |
| 6,487,879 | B1 | 12/2002 | Blackwell et al. |
| 6,488,509 | B1 | 12/2002 | Ho et al. |
| 6,509,137 | B1 | 1/2003 | Wang et al. |
| 6,558,819 | B1 | 5/2003 | Igarashi |
| 6,566,280 | B1 | 5/2003 | Meagley et al. |
| 6,576,409 | B2 | 6/2003 | Ichikawa et al. |
| 6,586,560 | B1 | 7/2003 | Chen et al. |
| 6,602,652 | B2 | 8/2003 | Adams et al. |
| 6,616,692 | B1 | 9/2003 | Glick et al. |
| 6,638,853 | B1 | 10/2003 | Sue et al. |
| 6,680,252 | B2 | 1/2004 | Chen et al. |
| 6,709,979 | B2 | 3/2004 | Komai et al. |
| 6,740,469 | B2 | 5/2004 | Krishnamurthy et al. |
| 6,767,689 | B2 | 7/2004 | Pavelchek et al. |
| 6,803,168 | B1 | 10/2004 | Padmanaban et al. |
| 6,803,172 | B2 | 10/2004 | Jung et al. |
| 6,838,223 | B2 | 1/2005 | Yoon et al. |
| 6,844,131 | B2 | 1/2005 | Oberlander et al. |
| 6,849,293 | B2 | 2/2005 | Rawat |
| 6,852,473 | B2 | 2/2005 | Roberts et al. |
| 6,852,474 | B2 | 2/2005 | Sabnis |
| 6,872,506 | B2 | 3/2005 | Neef et al. |
| 6,893,702 | B2 | 5/2005 | Takahashi |

(56) References Cited

U.S. PATENT DOCUMENTS

| | | | |
|---|---|---|---|
| 6,924,228 | B2 | 8/2005 | Kim et al. |
| 6,976,904 | B2 | 12/2005 | Li et al. |
| 7,074,527 | B2 | 7/2006 | Lu et al. |
| 7,108,958 | B2 | 9/2006 | Guerrero |
| 7,261,997 | B2 | 8/2007 | Cox et al. |
| 7,265,431 | B2 | 9/2007 | Sivakumar |
| 2002/0009599 | A1 | 1/2002 | Welch et al. |
| 2002/0031729 | A1 | 3/2002 | Trefonas, III et al. |
| 2002/0076642 | A1 | 6/2002 | Zampini et al. |
| 2002/0106898 | A1 | 8/2002 | Tsai |
| 2002/0110665 | A1 | 8/2002 | Rutter, Jr. et al. |
| 2002/0120070 | A1 | 8/2002 | Hong et al. |
| 2002/0120091 | A1 | 8/2002 | Scott |
| 2002/0160211 | A1 | 10/2002 | Kurita et al. |
| 2002/0182874 | A1 | 12/2002 | Wang |
| 2002/0183426 | A1 | 12/2002 | Lamb et al. |
| 2003/0017688 | A1 | 1/2003 | Hsu et al. |
| 2003/0040179 | A1 | 2/2003 | Thakar et al. |
| 2003/0049566 | A1 | 3/2003 | Sabnis et al. |
| 2003/0064608 | A1 | 4/2003 | Sabnis et al. |
| 2003/0122269 | A1 | 7/2003 | Weber et al. |
| 2003/0129531 | A1 | 7/2003 | Oberlander et al. |
| 2003/0129547 | A1 | 7/2003 | Neisser et al. |
| 2003/0143404 | A1 | 7/2003 | Welch et al. |
| 2003/0162120 | A1 | 8/2003 | Yoon et al. |
| 2003/0194636 | A1 | 10/2003 | Wanat et al. |
| 2003/0215736 | A1 | 11/2003 | Oberlander et al. |
| 2004/0010062 | A1 | 1/2004 | Ahn et al. |
| 2004/0018451 | A1 | 1/2004 | Choi |
| 2004/0053141 | A1 | 3/2004 | Pierrat |
| 2004/0058275 | A1 | 3/2004 | Neef et al. |
| 2004/0077173 | A1 | 4/2004 | Sivakumar |
| 2004/0210034 | A1 | 10/2004 | Cox et al. |
| 2004/0220379 | A1 | 11/2004 | Park et al. |
| 2005/0074699 | A1 | 4/2005 | Sun et al. |
| 2005/0148170 | A1 | 7/2005 | Bhave et al. |
| 2005/0167394 | A1 | 8/2005 | Liu et al. |
| 2005/0214674 | A1 | 9/2005 | Sui et al. |
| 2005/0255410 | A1 | 11/2005 | Guerrero et al. |
| 2006/0003601 | A1* | 1/2006 | Sugeta et al. ............ 438/781 |
| 2006/0019455 | A1 | 1/2006 | Bu et al. |
| 2006/0063106 | A1 | 3/2006 | Cox et al. |
| 2006/0088788 | A1* | 4/2006 | Kudo et al. ............ 430/311 |
| 2006/0160028 | A1 | 7/2006 | Lee et al. |
| 2007/0018286 | A1 | 1/2007 | Chen |
| 2007/0049030 | A1* | 3/2007 | Sandhu et al. .......... 438/689 |
| 2007/0049155 | A1* | 3/2007 | Moro et al. .............. 445/24 |
| 2007/0059639 | A1 | 3/2007 | Kanda et al. |
| 2007/0117049 | A1 | 5/2007 | Guerrero et al. |
| 2007/0117310 | A1* | 5/2007 | Bai et al. ............... 438/242 |
| 2007/0196772 | A1 | 8/2007 | Jung |
| 2007/0207406 | A1 | 9/2007 | Guerrero et al. |
| 2007/0212649 | A1 | 9/2007 | Lalbahadoersing et al. |
| 2007/0212654 | A1 | 9/2007 | Larson et al. |
| 2007/0264830 | A1 | 11/2007 | Huang et al. |
| 2008/0044772 | A1 | 2/2008 | Guerrero et al. |
| 2008/0319152 | A1* | 12/2008 | Okamoto et al. ........... 528/25 |
| 2009/0111281 | A1 | 4/2009 | Bencher et al. |
| 2009/0191474 | A1 | 7/2009 | Sun et al. |
| 2009/0258501 | A1* | 10/2009 | Chan ..................... 438/703 |
| 2009/0291397 | A1* | 11/2009 | deVilliers ............... 430/319 |
| 2009/0317739 | A1* | 12/2009 | Thiyagarajan et al. ... 430/270.1 |
| 2010/0009292 | A1* | 1/2010 | Nagai et al. ............ 430/286.1 |
| 2010/0130016 | A1* | 5/2010 | DeVilliers .............. 438/703 |
| 2011/0104616 | A1* | 5/2011 | Cheng et al. ............ 430/323 |

FOREIGN PATENT DOCUMENTS

| | | |
|---|---|---|
| EP | 1 061 560 | 12/2000 |
| EP | 1480081 | 11/2004 |
| EP | 1 772 776 | 4/2007 |
| EP | 1 845 416 | 10/2007 |
| EP | 1 959 479 | 8/2008 |
| GB | 2 288 184 | 11/1995 |
| JP | 04-151155 | 5/1992 |
| JP | 05-326358 | 12/1993 |
| JP | 06295064 | 10/1994 |
| JP | 07335884 | 12/1995 |
| JP | 08062401 A | 3/1996 |
| JP | 10149531 | 6/1998 |
| JP | 10307394 | 11/1998 |
| JP | 2003162065 | 6/2003 |
| JP | 2003183387 | 7/2003 |
| JP | 200570154 | 3/2005 |
| JP | 2008-083668 | 4/2008 |
| KR | 19970071126 | 11/1997 |
| KR | 1020010007323 | 1/2001 |
| WO | 2004076465 | 9/2004 |
| WO | 2004113417 | 12/2004 |
| WO | 2005001901 | 1/2005 |
| WO | 2005093513 | 10/2005 |
| WO | 2005111719 | 11/2005 |
| WO | 2008036496 | 3/2008 |
| WO | 2008039705 | 4/2008 |

OTHER PUBLICATIONS

Office action dated Jul. 27, 2010 in related case 11839317 filed Aug. 15, 2007.
International Search Report and Written Opinion dated Jan. 9, 2008 in related case PCT/US2007/076078 filed on Aug. 16, 2007.
International Preliminary Report on Patentability dated Dec. 3, 2008 in related case PCT/US2007/076078 filed on Aug. 16, 2007.
International Search Report and Written Opinion dated Aug. 20, 2009 in related case PCT/US2009/032446 filed on Jan. 29, 2009.
International Preliminary Report on Patentability dated Aug. 12, 2010 in related case PCT/US2009/032446 filed on Jan. 29, 2009.
Bencher, "SADP: The best option for <32nm NAND flash," Nanochip Technology Journal, vol. 5, No. 2, 2007, pp. 8-13.
Huang et al., "A new method to characterize conformality of BARC coatings," Proceedings of SPIE, vol. 5753, 2005, pp. 627-635.
Tseng et al., "A comprehensive comparison between double patterning and double patterning with spacer on sub-50nm product implementation," Proceedings of SPIE, vol. 6924, 2008, paper 69241Y.
International Search Report and Written Opinion dated Aug. 20, 2010 in corresponding case PCT/US2010/020199 filed on Jan. 6, 2010.
International Preliminary Report on Patentability dated Jul. 21, 2011 in corresponding PCT/US2010/020199 filed on Jan. 6, 2010.
Guerrero et al., "Material Development for DP Processes," Sep. 25, 2008, retrieved from Internet: URL:http:/www.sematech.org/meetings/archives/litho/8376/pres/0-DM-02_Guerrero_BSI.
Office Action dated May 24, 2012 in related U.S. Appl. No. 13/114,612, filed May 24, 2011.
Office Action dated Mar. 2, 2011 in related U.S. Appl. No. 12/362,268, filed Jan. 29, 2009.
Office Action dated Jun. 9, 2011 in related U.S. Appl. No. 12/362,268, filed Jan. 29, 2009.
White et al, "Synthesis and Characterizations of Photodefinable Polycarbonates for Use as Sacrificial Materials in the Fabrication of Microfluidic Devices," School of Chemical Engineering, Georgia Institute of Technology, Atlanta, GA 30332-0100, Advances in Resist Technology and Processing XIX, Theodore H. Fedynyshyn, Editor, Proceedings of SPIE, vol. 4690 (2002), pp. 242-253.
Sturtevant et al., "Removable Organic Antireflection Coating", Advances in Resist Technology and Processing XIII, Roderick R. Kunz, Chair/Editor, SPIE, vol. 2724, pp. 738-746 (Mar. 1996).
Yoshino et al., "Compatibility of Chemically Amplified Photoresists with Bottom Anti-Reflective Coatings," Advances in Resist Technology and Processing XV, Will Conley, Chair/Editor, SPIE, vol. 3333, pp. 655-661 (Feb. 1998).
Okoroanyanwu, "Limits of Ultrathin Resist Processes," Future Fab Intl., Sep. 2003, pp. 1-15, http://www.future-fab.com/login.asp?s_id=0&d_ID=1158&login=true&mode=print.
Translation of JP Pub No. JP 10307394, Nov. 11, 1998, 33 pages.
Translation of JP Pub No. JP 10149531, Jun. 2, 1998, 17 pages.
Translation of JP Pub No. JP 08062401A, Mar. 8, 1996, 7 pages.
Translated Abstract of JP No. 200570154, Mar. 17, 2005, 1 page.

(56) References Cited

OTHER PUBLICATIONS

Yamada et al., "Positive and Negative Tone Water Processable Photoresist: A Progress Report," SPIE vol. 3333, pp. 245-253 (1998).
Yamada et al., "The Design and Study of Aqueous-Processable Positive Tone Photoresists," SPIE vol. 3999. pp. 569-578 (2000).
Moon et al, "Three-Component Photopolymers Based on Thermal Cross-Linking and Acidolytic De-Cross-Linking of Vinyl Ether Groups. Effects of Binder Polymers on Photopolymer Characteristics," Chemistry of Materials, vol. 6, No. 10, Oct. 1994, pp. 1854-1860.
Translation of JP Pub No. JP 06295064, Oct. 21, 1994, 16 pages.
Lee et al., "Performance of Vinyl Ether Cross-Linkers on Resist for 193 nm Lithography," SPIE vol. 4690, pp. 541-548 (2002).
"Aqueous Processable Positive and Negative Tone Photoresists," Willson Research Group, University of Texas at Austin, Apr. 18, 2001, http://willson.cm.utexas.edu/Research/Sub_Files/Water_Soluble, 7 pages.
Guerrero et al., "Photochemical Studies on Bottom Anti-Reflective Coatings," Journal of Photopolymer Science and Technology, vol. 19, No. 3, 2006, pp. 343-347.
Mack, "Antireflective Coatings," Microlithography World, Summer 1997, pp. 29-30.
Rubin et al, "Ion Implantation in Silicon Technology," American Institute of Physics, Jun./Jul. 2003, pp. 12-15.
Case Technology Inc., Ion Implantation, www.casetechnology.com/links.html, pp. 1-24.
2.2.3 Implantation Dose, www.iue.tuwien.ac.at/phd/hoessinger/node23.html, 1 page.
2.2.2 Ion Beam Energy, www.iue.tuwien.ac.at/phd/hoessinger/node22.html, 5 pages.
2.2.4 Tilt and Twist Angle, www.iue.tuwien.ac.at/phd/hoessinger/node24.html, 2 pages.
2.2 Ion Implantation Process Parameters, www.iue.tuwien.ac.at/phd/hoessinger/node20.html, 1 page.
2.2.1 Dopant Species, www.iue.tuwien.ac.at/phd/hoessinger/node21.html, 2 pages.
Ion Implantation Process, p2library.nfesc.navy.mil/P2_Opportunity_Handbook/1_12.html, 6 pages.
Translation of JP Pub No. 2003162065; Jun. 6, 2003, 19 pages.
Okazaki et al., "Positive-Working Photosensitive Alakline-Developable Polyimide Precursor Based on Semi-Alicyclic Poly (amide acid), Vinyl Ether Crosslinker, and a Photoacid Generator," J. Photopolym Sci Technol, vol. 19, No. 2, p. 277-280.

* cited by examiner

SPIN-ON SPACER MATERIALS FOR DOUBLE- AND TRIPLE-PATTERNING LITHOGRAPHY

RELATED APPLICATIONS

This application claims the priority benefit of a provisional application entitled SPIN-ON SPACER MATERIALS FOR DOUBLE-PATTERNING LITHOGRAPHY, Ser. No. 61/143,013, filed Jan. 7, 2009, incorporated by reference herein.

BACKGROUND OF THE INVENTION

Field of the Invention

The present invention is broadly concerned with novel, multiple patterning methods that utilize a shrinkable composition to form spacer structures.

Description of the Prior Art

Due to delays in developing the next generation of 193-nm immersion technology and extreme ultraviolet lithography (EUVL), double patterning using currently available tools is the only lithographic technique planned for use from 2008 to 2012 for the 32- and 22-nm half-pitch nodes. Self-aligned spacer technology is one double-patterning technology under extensive investigation. The spacer approach has the advantage of requiring only one lithographic exposure, which avoids the serious issue of overlay between successive exposures. Spacers are created by depositing a coating on prepatterned features and then etching to remove those portions of the film present on the horizontal surfaces, which leaves the spacer film layer lining only the sidewalls. The original patterned feature is then removed to leave only the spacers. Because two spacers are created for every line, the line density doubles. As a result, 32-nm or smaller dense lines can be fabricated.

There have been prior attempts using spacer technology based on films applied using CVD (chemical vapor deposition) processes. The process involves several CVD steps to prepare the layers under the photoresist before photolithography. After photolithography, several steps of etching are used to open the underlayers to prepare the template. After the template is prepared, CVD is used to apply a conformal coating, which can be further etched to form spacers. The need for so many steps makes the process costly and inefficient. Furthermore, the accumulation of layers leads to the inability to control CD (critical dimension).

Other attempts have been made to double the frequency or pitch of small features using materials and a process called resolution enhancement lithography assisted by chemical shrink (RELACS). The RELACS process is based on a crosslinking reaction induced by acid that is diffused out from the resist and involves four steps: spin-coating; blanket exposure; baking; and developing. The primary application of the technology has been to shrink contact holes, which depends upon a chemical interaction induced by the resist. This approach is not useful for forming small lines, but rather only has applicability to double the frequency of large (>100-nm) lines fabricated by KrF (248-nm) technology because the KrF RELACS process is performed under relatively mild conditions (<120° C.). However, the fabrication of 32-nm lines is based on ArF (193-nm) technology. The mobility of acid in an ArF resist is extremely low, and the ArF RELACS process requires a high baking temperature (>120° C.), which will distort the original resist lines. Thus, this process lacks potential for any practical applications.

SUMMARY OF THE INVENTION

The present invention addresses the problems of the prior art by providing a method of forming a microelectronic structure. The method comprises providing a precursor structure having a patterned surface. The patterned surface includes at least one raised feature having sidewalls and an upper surface: A shrinkable composition is applied to the patterned surface, so that it covers the feature sidewalls and upper surface. The shrinkable composition is healed so as to form a conformal layer of the composition on the patterned surface and over the raised feature. At least some of the conformal layer is removed to yield a pre-spacer structure comprising the raised feature and remnants of the conformal layer against the raised feature sidewalls.

DETAILED DESCRIPTION OF THE PREFERRED EMBODIMENTS

The Inventive Method

The present invention provides a novel two-step approach that is based upon coating shrinkage.

Figure 1:
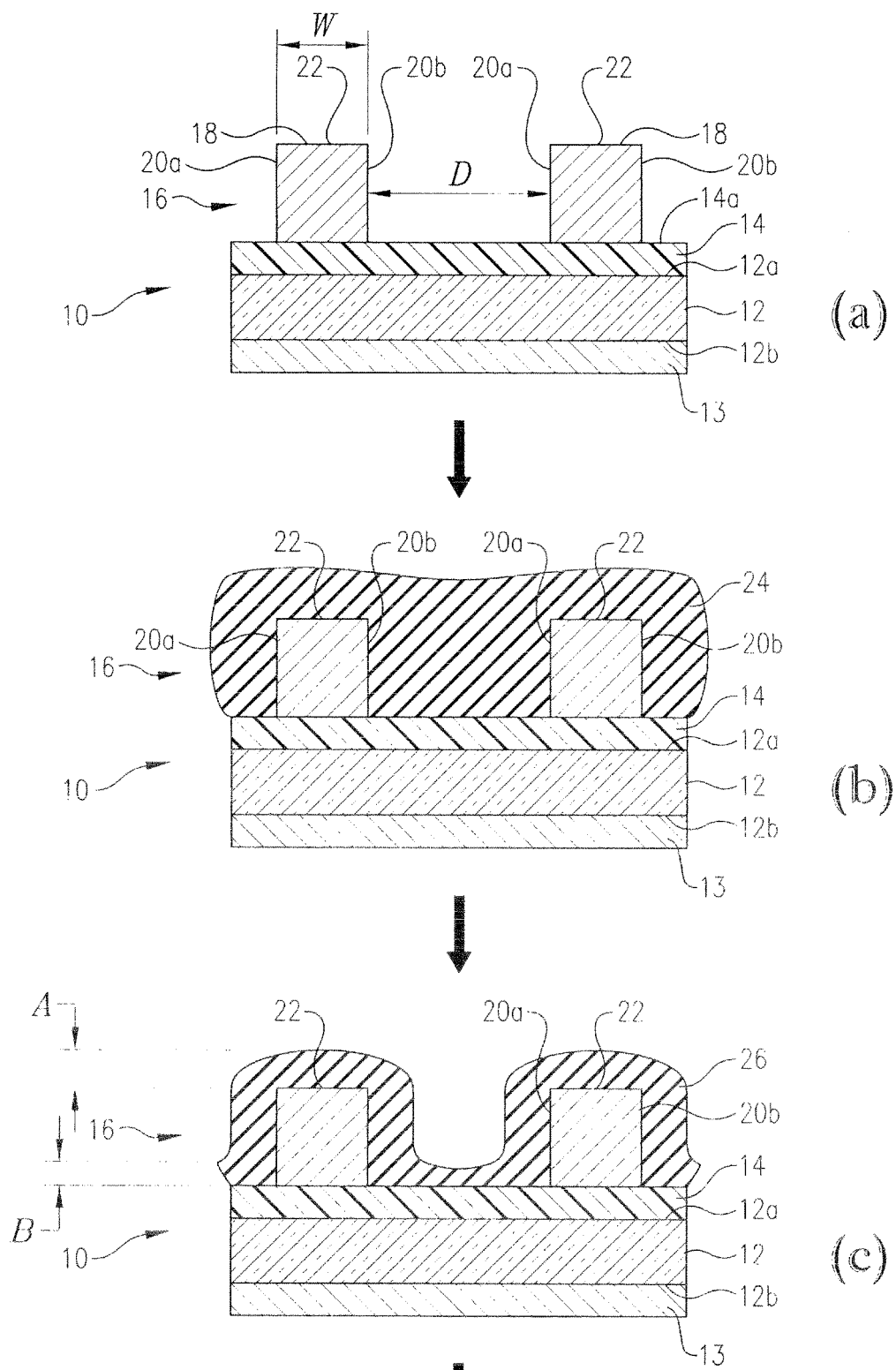
FIG. 1 is a schematic depiction of a double-patterning process according to the invention.
Figure 1:
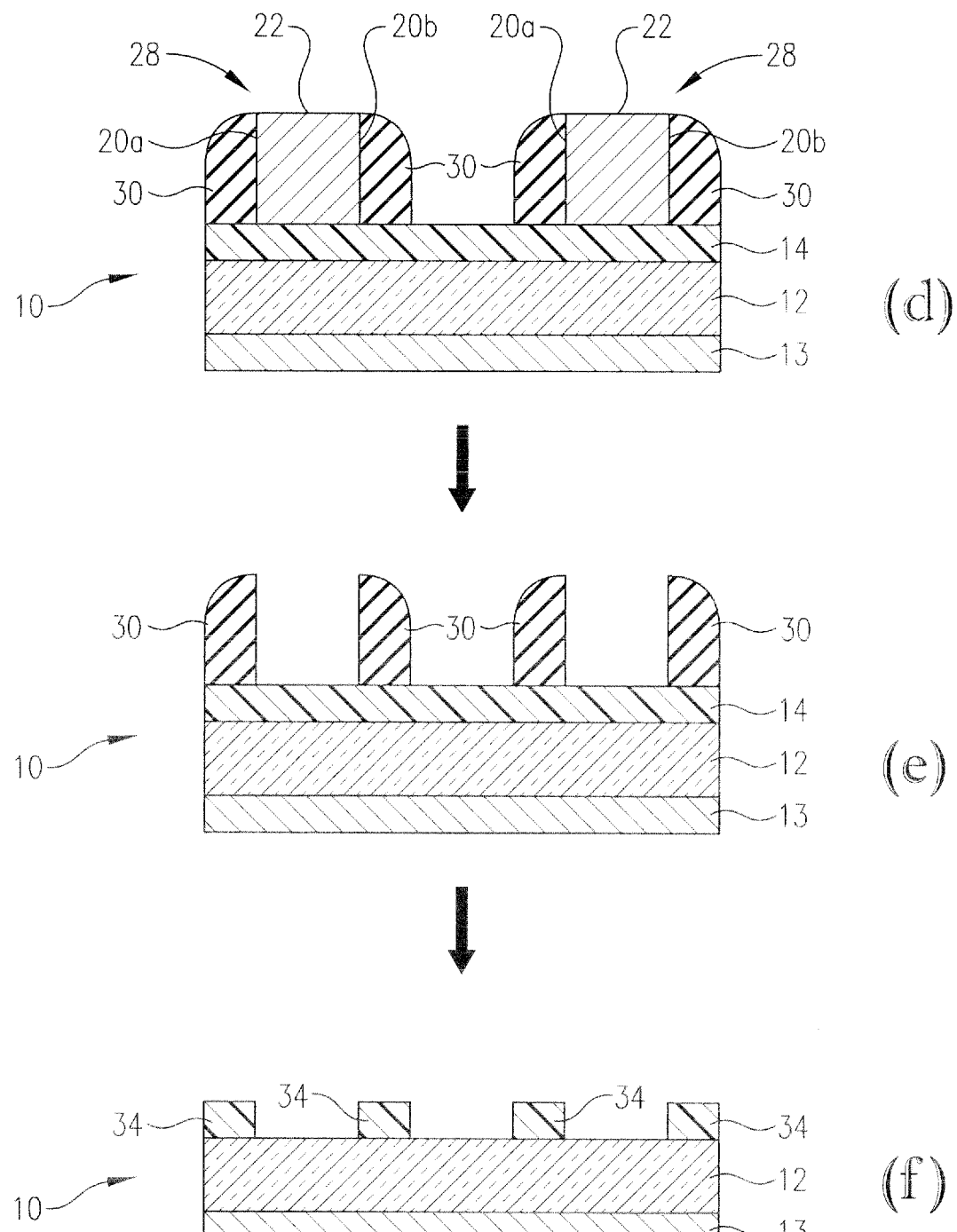

FIG. 1 illustrates one embodiment of the invention, where FIG. 1(a) depicts a patterned precursor structure 10. Structure 10 includes first layer 12, having an upper surface 12a and a backside 12b. It will be appreciated that the embodiment illustrated in FIG. 1 is a "snapshot" of the particular microelectronic process. That is, the steps described in FIG. 1 could be at the beginning of the process so that the snapshot depicts the first layers in the "stack" that is being fabricated. Or, the steps could be in the middle of the stack being fabricated, or the last steps in the process so that the snapshot shows some of the last stages involved in building the stack. Thus, backside 12b could have any number of layers or substrates 13 adjacent it, including conventional microelectronic substrates such as those selected from the group consisting of silicon, SiGe, SiO$_2$, Si$_3$N$_4$, aluminum, tungsten, tungsten silicide, gallium arsenide, germanium, tantalum, tantalum nitride, coral, black diamond, phosphorous or boron doped glass, and mixtures of the foregoing.

First layer 12 is preferably a spin-on carbon layer ("SOC") or amorphous carbon layer, and it can be applied and formed according to any prior art processes, which typically involve spin-coating. A spin-on carbon layer will preferably comprise at least about 80% carbon atoms, and even more preferably from about 80% to about 95% carbon atoms, based upon the total number of atoms in all the solids in the composition taken as 100%. One having ordinary skill in the art can readily calculate this percentage based upon the chemical structure of the solids included in the composition. The thickness of the first layer 12 will typically be from about 50 nm to about 1,000 nm, and preferably from about 100 nm to about 300 nm.

Structure 10 further includes a second layer 14 adjacent upper surface 12a. Second layer 14 includes an upper surface 14a and can be applied by any known application method and processed according to known conditions. Second layer 14 is preferably a hard mask layer, although it could also be an organic bottom anti-reflective coating. The composition that forms second layer 14 can be applied by any known application method, with one preferred method being spin-coating the composition at speeds of from about 1,000 rpm to about 4,000 rpm (preferably from about 1,500 rpm to about 2,500 rpm) for a time period of from about 10 seconds to about 60 seconds (preferably from about 20 seconds to about 60 seconds). The composition is then baked so as to induce thermal crosslinking. Preferred baking conditions involve temperatures of at least about 100° C., preferably from about 120° C. to about 250° C., and more preferably from about 160° C. to about 200° C., and for a time period of from about 20 seconds to about 60 seconds. The thickness of the crosslinked second layer 14 will typically be from about 20 nm to about 150 nm, and preferably from about 30 nm to about 100 nm.

Preferably, the second layer 14 has an n-value of from about 1.4 to about 2, and more preferably from about 1.6 to about 2, and a k-value of from about 0 to about 0.6 at the wavelength of use (e.g., 365 nm, 248 nm, 193 nm, 157 nm, or 13.5 nm). Advantageously, the cured second layer 14 will be sufficiently crosslinked that it will be substantially insoluble in typical organic solvents such as ethyl lactate, propylene glycol methyl ether acetate (PGMEA), propylene glycol methyl ether (PGME), propylene glycol n-propyl ether (PnP), cyclohexanone, acetone, Gamma butyrolactone (GBL), and mixtures thereof. Thus, when subjected to a stripping test, the cured second layer 14 will have a percent stripping of less than about 5%, preferably less than about 1%, and even more preferably about 0%. The stripping test involves first determining the thickness by taking the average of measurements at five different locations of the cured second layer 14. This is the initial average film thickness. Next, a solvent (e.g., ethyl lactate) is puddled onto the cured film for about 20 seconds, followed by spin drying at about 2,000-3,500 rpm for about 20-30 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

In a preferred embodiment, a photosensitive composition can then be applied to the cured second layer 14 to form an imaging layer (not shown), followed by imaging, light exposure, and developing to form pattern 16. Although this can be accomplished by known methods, one possible process is described herein. In this process, the photosensitive composition is preferably spin-applied and then post-application baked ("PAB") at a temperature of at least about 80° C., preferably from about 80° C. to about 130° C., and more preferably from about 100° C. to about 120° C., and for time periods of from about 60 seconds to about 120 seconds. Suitable photosensitive compositions include commercially-available photoresists, or any other photosensitive compositions. The thickness of the imaging layer after baking will typically be from about 50 nm to about 1,000 nm, and more preferably from about 60 nm to about 400 nm.

The imaging layer is then exposed to radiation with a photomask (not shown) positioned above the surface of the imaging layer. The mask has open areas designed to permit radiation to pass through the mask and contact surface of the imaging layer. The remaining solid portions of the mask are designed to prevent radiation from contacting the surface of the imaging layer in certain areas. Those skilled in the art will readily understand that the arrangement of open areas and solid portions is designed based upon the desired pattern to be formed in the imaging layer and ultimately in the layers below the imaging layer. The present inventive process can be used with radiation of most wavelengths under 500 nm, but preferred wavelengths are selected from the group consisting of 365 nm, 248 nm, 193 nm, 157 nm, and 13.5 nm.

Upon exposure, the portions of the imaging layer that are exposed to radiation are rendered soluble in photoresist developer. After exposure, the imaging layer is preferably subjected to a post-exposure bake (PEB) at a temperature of from about 80° C. to about 180° C., more preferably from about 100° C. to about 180° C., for a time period of from about 60 seconds to about 120 seconds. The exposed portions of the imaging layer, which were made soluble by the above process, are then contacted with a photoresist developer to remove the exposed portions, forming the patterned layer 16 shown in FIG. 1.

Patterned layer 16 includes raised features 18 (e.g., lines). Although FIG. 1 only shows two raised features 18, it will be appreciated that any number of raised features could be formed according to the current knowledge in the art. Each raised feature 18 includes respective first and second sidewalls 20a, 20b, which are substantially perpendicular to upper surface 14a, as well as respective surfaces 22, which are substantially parallel to upper surface 14a. Furthermore, it is preferred that the width W of feature 18 is from about 20 nm to about 100 nm, more preferably from about 22 nm to about 80 nm, and even more preferably about 32 nm.

The above process describes the process for forming raised features 18 from photosensitive composition. However, it will be appreciated that the features 18 could also be formed from a number of other compositions. For example, features 18 could also be formed in layers selected from the group consisting of anti-reflective, hard mask, amorphous carbon, silicon, oxide (e.g., metal oxide) layers. With any of these layer types, features 18 would be formed according to known processes. For example, the particular layer could be formed on second layer 14, after which an imaging layer is formed on that layer. The imaging layer would then be patterned as described above, and that pattern would be transferred (e.g., via etching) to the alternative layer to form features 18. Regardless of the material from which the features 18 are formed, the key is to provide the patterned structure 10 with those features 18. Furthermore, it is preferred that the features 18 have a pitch (W:D) of from about 1:2 to about 1:4, and more preferably about 1:3 (see FIG. 1(b)). In a particularly preferred embodiment, W is 32 nm while D is 96 nm.

Once the patterned structure 10 has been formed, either by the above-described process or by other processes known in the art, a shrinkable composition 24 is applied to the upper surface 14a of second layer 14, as well as to the sidewalls 20a, 20b and upper surfaces 22 of the features 18. The shrinkable composition 24 can be applied by any known methods, but it is preferably spin-applied or spin-coated.

The shrinkable composition 24 is then heated, causing it to shrink dramatically by releasing many small molecules, thus forming the conformal coating 26 illustrated in FIG. 1(c). The temperatures to which shrinkable composition is heated will depend upon the material from which features 18 are formed. For example, when features 18 are formed from a photoresist composition, shrinkable composition 24 is heated to temperatures of less than about 120° C., preferably less than about 110° C. and more preferably from about 80° C. to about 100° C. When features 18 are formed from a material other than a photoresist composition, shrinkable composition 24 is heated to temperatures of less than about 300° C., preferably less than about 250° C., and more preferably from about 100° C. to about 210° C.

Advantageously, there are no chemical interactions between conformal coating 26 and the sidewalls 20a, 20b or upper surfaces 22 of features 18. This allows the process to be used with any type of feature 18. Furthermore, the above baking temperatures allow the process to be used under mild conditions that avoid distortion of features 18.

It is preferable that A equals B (still referring to FIG. 1(c)), and even more preferably B is less than A, thus allowing the pre-spacer formation to be accomplished with very little etching. "A" represents the thickness of conformal coating 26 on top of a feature 18 at its thickest point, while "B" represents the thickness of conformal coating 26 at its thinnest point between features 18 (i.e., at the lowest point of the "valley" between features). Using locations A and B as a reference, shrinkable composition 24 will shrink by at least about 25%, preferably at least about 35%, more preferably at least about 50%, and even more preferably from about 55% to about 90% during this heating step.

Next, and referring to FIG. 1(d), conformal coating 26 is subjected to an etching process to form pre-spacers 28. Suitable etchants include those selected from the group consisting of $Cl_2$, $CF_4$, $CH_3F$, and $CHF_3$, and typical etch rates are from about 1 Å/second to about 10 Å/second, and preferably from about 3 Å/second to about 8 Å/second. Additional, etching could be accomplished via conventional wet etching processes. Each pre-spacer 28 comprises the raised feature 18 and shrinkable composition remnants 30. As depicted in FIG. 1(d), there is a remnant 30 against each sidewall 20a, 20b. The raised features 18 are then removed (e.g., by $O_2$ etching) from each pre-spacer 28, leaving behind the remnants 30 (FIG. 1(e)). The remnants 30 act as "spacers," for forming very small features (e.g., lines that are less than about 70 nm, preferably less than about 50 nm, and more preferably less than about 32 nm). That is, the structure 10 is subjected to an etching process that transfers the pattern created by the remnants 30 to the second layer 14, thus forming lines 34 in second layer 14. The etching process removes the remnants 30 as well as the second layer 14 in the areas not protected by remnants 30. Suitable etchants include those selected from the group consisting of $Cl_2$, $CF_4$, $CH_3F$, and $CHF_3$, and typical etch rates are from about 1 Å/second to about 10 Å/second, and preferably from about 3 Å/second to about 8 Å/second. The pattern can be further transferred to the first layer 12 and to substrate 13, using conventional techniques, if desired.

Figure 2:
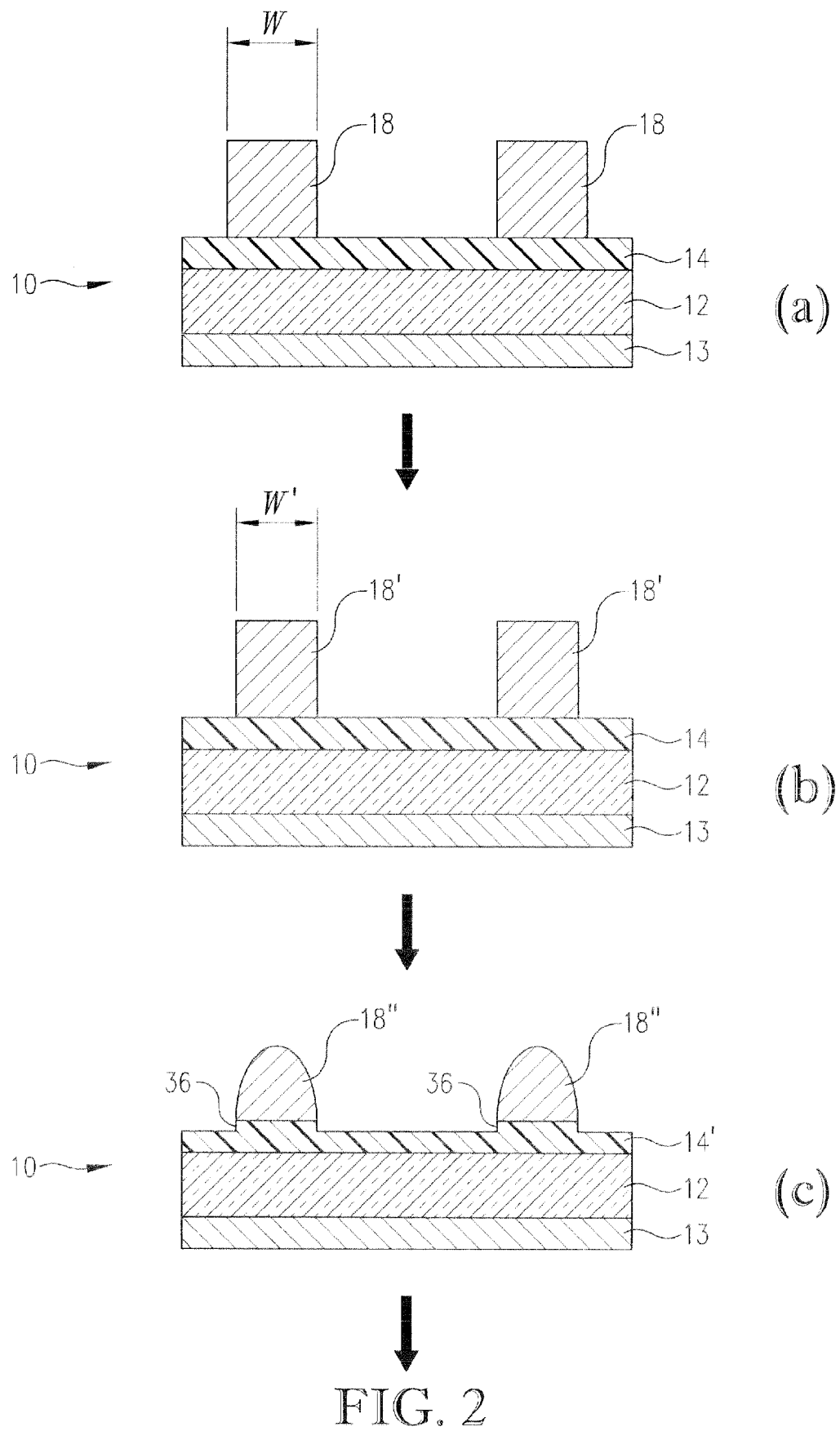
FIG. 2 is a schematic illustration depicting a triple-patterning process according to the invention.
Figure 2:
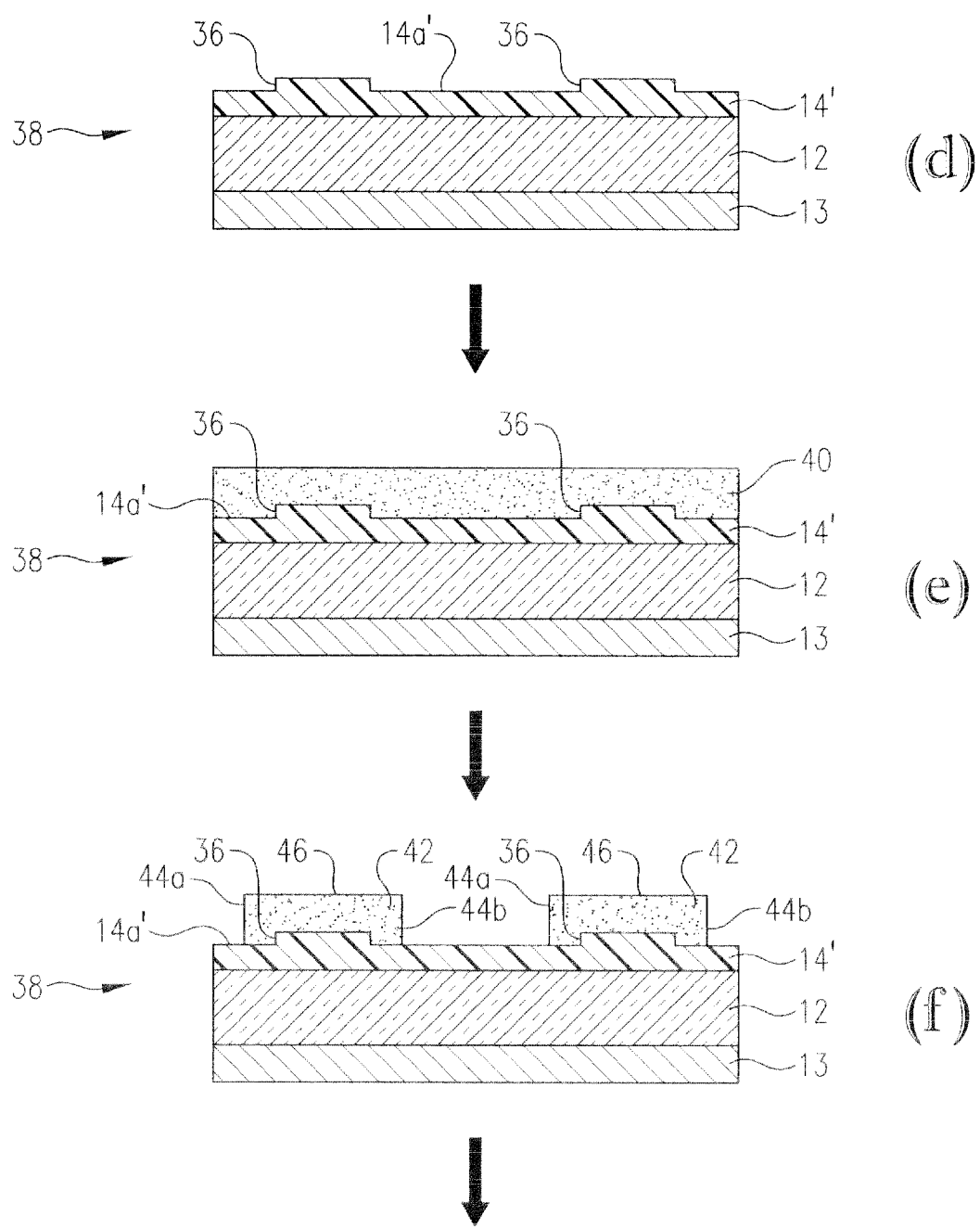
Figure 2:
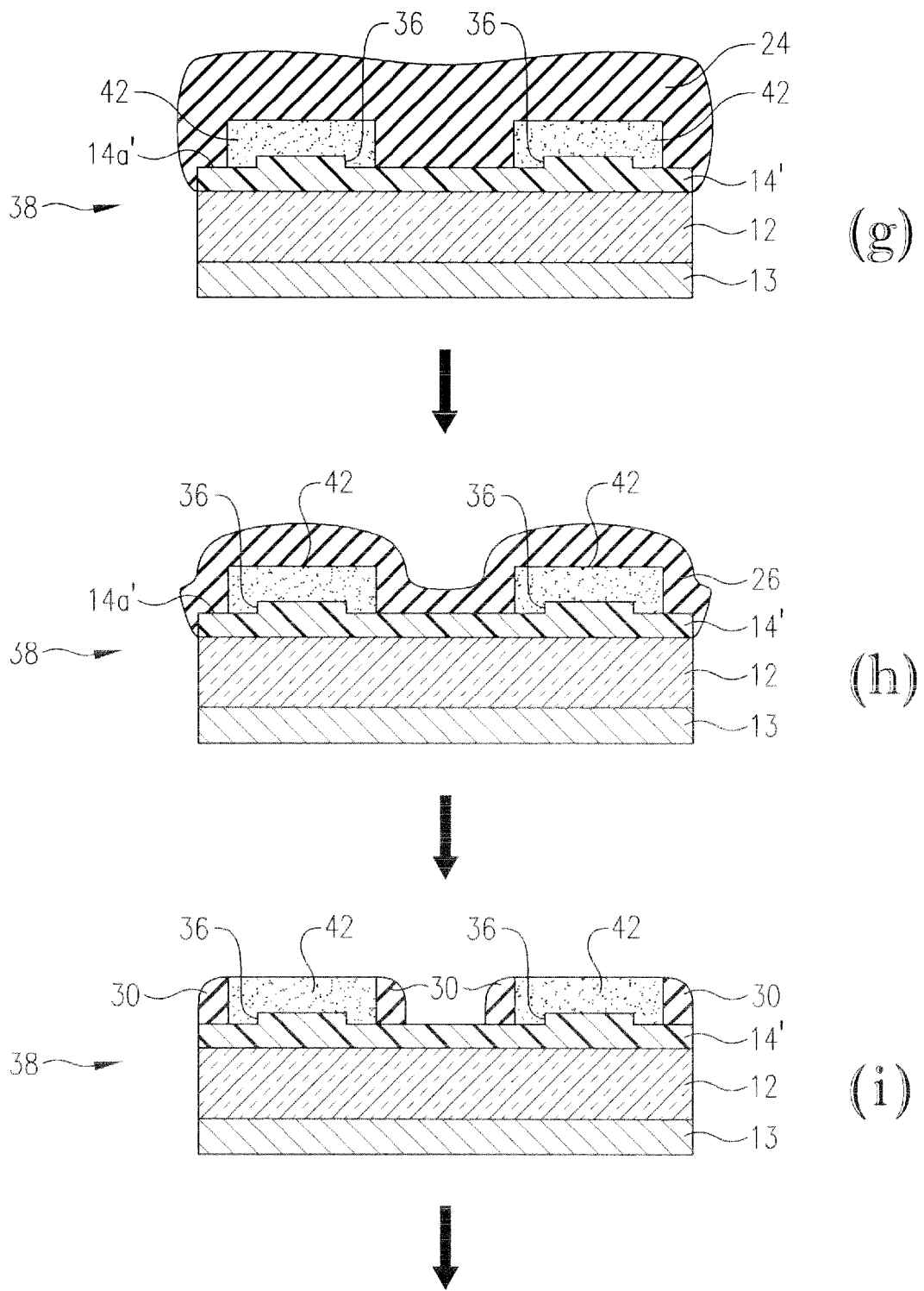
Figure 2:
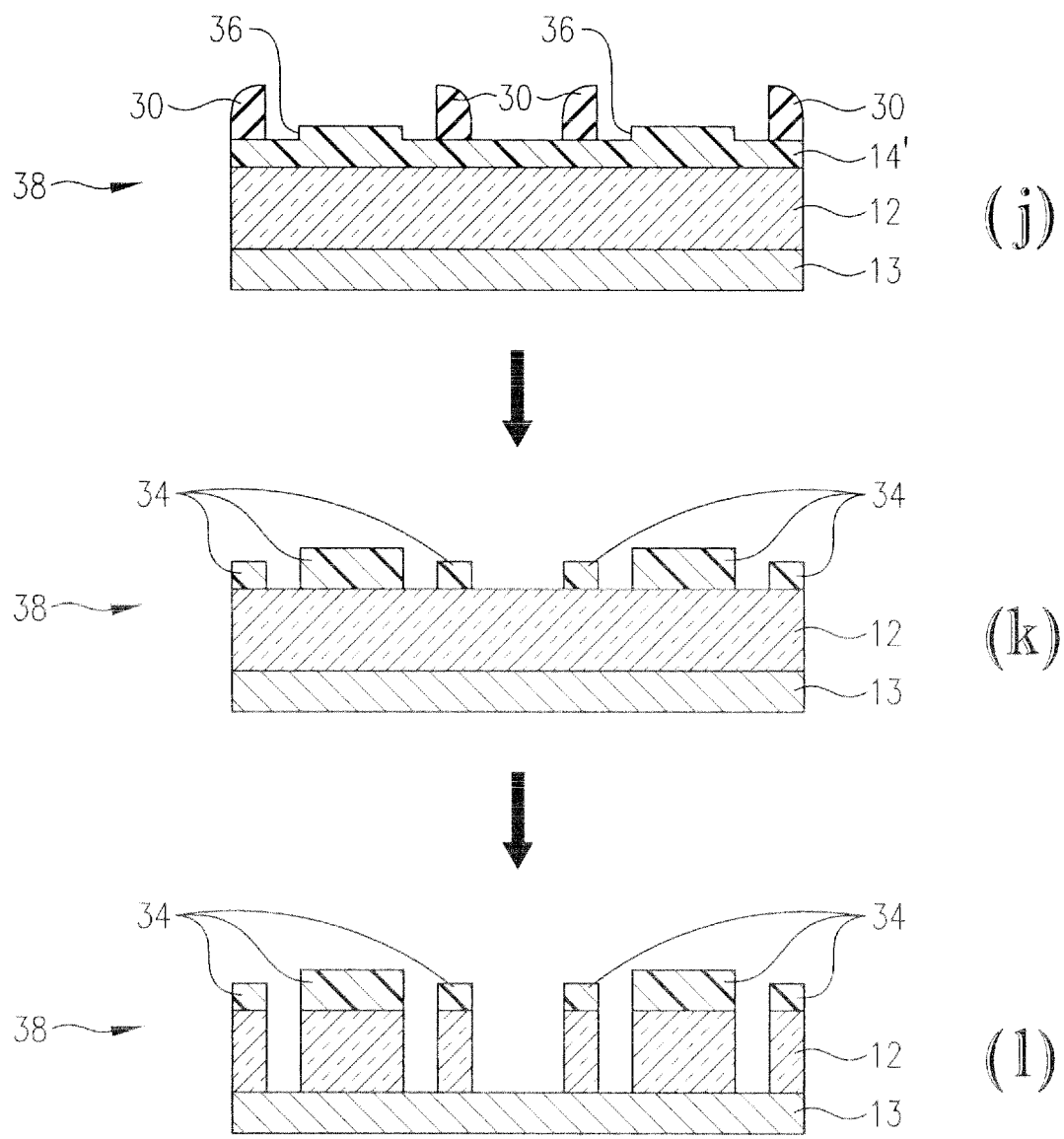

The above process describes a double-patterning process according to the invention. Advantageously, the double-patterning process can be modified by adding an extra etch step to yield a triple-patterning process. This process is shown in FIG. 2, where like numbering is used to designate similar materials. Also, the same processing conditions (e.g., spin speeds, temperatures, etching, time periods, etc.) would be used as described with respect to FIG. 1, unless stated otherwise.

Referring to FIG. 2(a), it will be seen that the patterned structure 10 is again provided as described above. Raised features 18 will typically have a width W as described previously. Those features 18 are then "trimmed" so that their respective widths are at least cut in half (FIG. 2(b)). That is, the trimmed features 18' will preferably have a width W' that is from about 50 nm to about 90 nm, more preferably from about 60 nm to about 80 nm, and even more preferably about 70 nm. This trimming can be accomplished by any known process, with one suitable process involving plasma etching.

As shown in FIG. 2(c), the features 18' and second layer 14 are then subjected to a partial etch process to yield arched features 18" and partially etched second layer 14', which includes lower raised features or "nubs" 36. Suitable etchants for this partial etching step include those selected from the group consisting of $Cl_2$, $CF_4$, $CH_3F$, and $CHF_3$, and typical etch rates are from about 1 Å/second to about 10 Å/second, and preferably from about 3 Å/second to about 7 Å/second.

The arched features 18" are then removed (e.g., by etching) to leave the patterned structure 38 shown in FIG. 2(d). A photosensitive layer 40 (FIG. 2(e)) is applied to the upper surface 14a' and to nubs 36, using known processes, such as that described previously. Photosensitive layer 40 is then patterned (exposed and developed) to yield raised features 42, as depicted in FIG. 2(f). Each raised feature 42 includes respective first and second sidewalls 44a, 44b, which are substantially perpendicular to upper surface 14a', as well as respective upper surfaces 46, which are substantially parallel to upper surface 14a'.

Next, the shrinkable composition 24 is applied to the upper surface 14a' of second layer 14', as well as to the sidewalls 44a, 44b and upper surfaces 46 of the features 42 as described previously and as shown in FIG. 2(g). Composition 24 is then subjected to the shrinking process previously described (FIG. 2(h)) to form conformal coating 26. The remaining steps of FIG. 2(i)-(k) are similar to those described above with respect to FIG. 1(d)-(f). It will be noted, however, that the embodiment of FIG. 2 triples the pattern rather than doubles it (i.e., the embodiment of FIG. 2 results in 50% more lines 34 than that of FIG. 1). Advantageously, lines 34 will also be quite small, having widths of less than about 70 nm, preferably less than about 50 nm, and more preferably from about 16 nm to about 32 nm.

Finally, FIG. 2(l) illustrates the additional step of transferring the pattern to the first layer 12. As was the case with the previous embodiment, this pattern can be further transferred to the substrate 13, if desired.

It will be appreciated that the above-described process is photoresist independent, and no interaction occurs between the coating and the substrate as described above. As a result, this process can be extended to any substrate and can be applied under mild conditions (<120° C.), which avoids distortion of the original lines. Thus, this new approach is based on different mechanisms than, and provides significant advantages over, the prior art approaches. The process can be used to double, and even triple, the frequency of dense lines. As used herein, "dense" refers to a region having at least about 50% of its surface area filled with features 18.

Compositions for Use as Shrinkable Composition 24

The composition for use as shrinkable composition 24 is preferably an organic or organometallic composition and will exhibit certain properties making it suitable for this application. For example, the composition must exhibit high shrinkage during the heating steps described above. This means that, if the features 18 are formed from a photoresist composition, the shrinkable composition 24 must decompose at temperatures of less than about 120° C., preferably less than about 110° C., and more preferably from about 80° C. to about 100° C., so that the composition shrinks without destroying features 18. If the features 18 are formed from a material other than a photoresist composition, the shrinkable composition 24 must decompose at temperatures of less than about 300° C., preferably less than about 250° C., and more preferably from about 100° C. to about 210° C., so that the composition shrinks without destroying features 18.

The shrinkable composition 24 preferably comprises an organic solvent that can be used to dissolve or disperse the solids within the composition 24. Preferably, the solvent system is selected so that it will not distort the photoresist pattern, with preferred solvents being selected from the group consisting of mesitylene, methyl isobutyl carbinol, d-limonene, and mixtures thereof. This is particularly beneficial for embodiments where features 18 are formed from a photoresist composition, which is typically more fragile than other substrates. In embodiments where features 18 are not formed from a photoresist composition, the solvent system could include the above solvents and/or solvents selected from the group consisting of ethyl lactate, propylene glycol methyl ether, propylene glycol methyl ether acetate, and propylene glycol n-propyl ether.

It is also highly desirable that the shrinkable composition etch more slowly than the features 18. Thus, the etch selectivity of the shrinkable composition as compared to that of the features 18 is preferably less than about 0.30, more preferably less than about 0.25, and more preferably from about 0.001 to about 0.10. When features 18 are formed from a photoresist composition, these numbers are achieved using $O_2$ as the etchant. When features 18 are formed from a material other than a photoresist composition, these numbers are achieved using $Cl_2$, $CF_4$, $CH_3F$, or $CHF_3$ as the etchant.

One suitable shrinkable composition comprises a crosslinker or crosslinking agent dispersed or dissolved in a solvent system. Crosslinking agents are suitable because they can self-condense into a network with significant shrinkage. A typical crosslinking agent suitable for use in the present invention is an aminoplast such as poly(melamine-co-formaldehyde) methylated (sold under the name Cymel® 303, by Cytec industries). Other suitable crosslinking agents include those selected from the group consisting of poly (melamine-co-formaldehyde) butylate/isobutylate, hexamethylmelamine glycoluril (such as that sold under the name: Powderlink®, by Cytec Industries), 1,3-bis(methoxymethyl)-4,5-bis(methoxy)-ethylenurea ("BMNU"), 1,3-bis (methoxymethyl)urea ("BMU"), and the following derivatives:

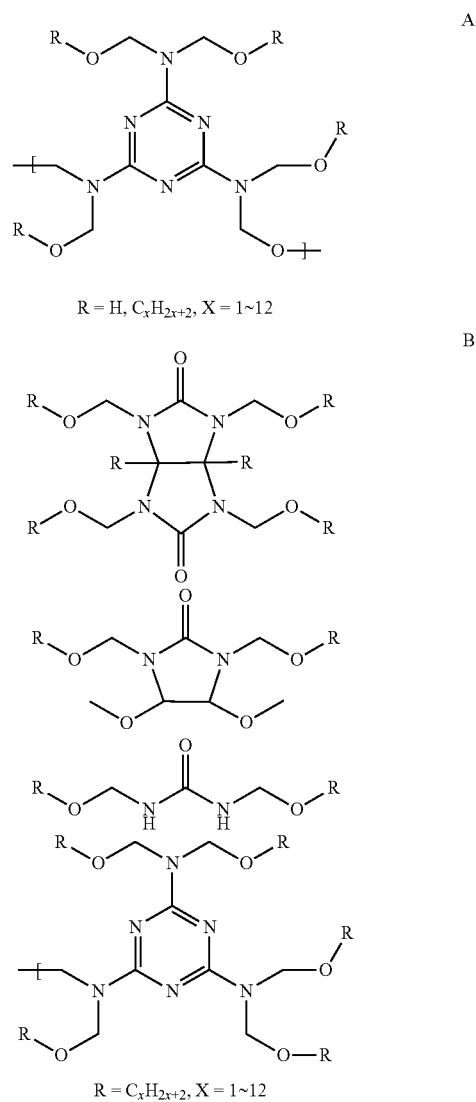

The degree of shrinkage depends upon the molecular weight of released alcohol and the baking temperature. Greater shrinkage can be achieved by combining a large released molar mass of alcohol, such as butanol, and a higher-temperature baking. An etch-resistant polymer, such as polysiloxane, can be blended with the crosslinker to improve the etch selectivity, if desired.

For this type of composition, the solvent system preferably comprises one or more solvents selected from the group consisting of propylene glycol monomethyl ether ("PGME"), mesitylene, methyl isobutyl carbinol, d-limonene, and mixtures thereof. Furthermore, the solids content of the composition of this embodiment is preferably from about 1% to about 15% by weight, and more preferably from about 3% to about 10% by weight, based upon the total weight of the composition taken as 100% by weight. The crosslinking agent will preferably be present at a level of from about 80% to about 99% by weight, and more preferably from about 90% to about 95% by weight, based upon the total weight of solids in the composition taken as 100% by weight.

The composition will also comprise an acid, such as those selected from the group consisting of p-toluene sulfonic acid, dinonyl naphthalene sulfonic acid, trifluoromethane sulfuric acid, and heptadecafluoro octanesulfonic acid. The acid will preferably be present at a level of from about 1% to about 70% by weight and more preferably from about 5% to about 10% by weight, based upon the total weight of crosslinking agent in the composition taken as 100% by weight.

This crosslinker-containing family of compositions is more suitable for embodiments where features 18 are not formed from a photoresist composition because this family of compositions achieves better shrinkage at higher bake temperatures.

Other suitable compositions comprise a polymer having acid-labile side chains from chain polymerization dispersed or dissolved in a solvent system. A thick film is prepared via spin-coating as described previously, and when the film is baked, acid cleaves the acid-labile side chain, resulting in the release of volatile products. As the side chain is released, the film shrinks significantly. The degree of shrinkage is determined by the composition and size of the side chain. The side chain can be selected so that it can be cleaved by an acid at low temperatures (e.g., less than about 120° C.), thus making this family of compositions also suitable for use in situations where features 18 are formed from a photoresist composition as well as for features 18 that are formed from a material other than a photoresist composition.

Monomers for use in these polymers include those selected from the group consisting of styrene, methyl acrylate, and acrylate derivatives. Some suitable styrene-based monomers include:

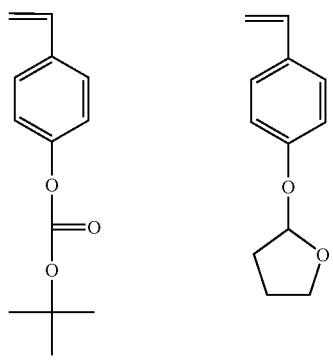 [SMILES: C=Cc1ccc(OC(=O)OC(C)(C)C)cc1 ; C=Cc1ccc(OC2CCCO2)cc1]

Some suitable acrylate or methacrylate monomers with acid labile side chains include:

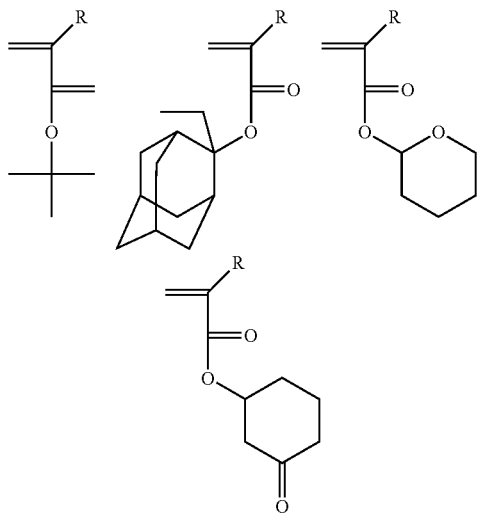

R = H or CH₃

Sources of the acid-labile side chains can include those selected from the group consisting of t-butyl, the acetyl family, the adamantyl family, and the lactone family. An etch-resistant component can also be used to prepare a copolymer with suitable etch-resistant properties, if desired.

For this type of composition, the solvent system preferably comprises one or more solvents selected from the group consisting of mesitylene, methyl isobutyl carbinol, d-limonene, and mixtures thereof. Furthermore, the solids content of the composition of this embodiment is preferably from about 2% to about 15% by weight, and more preferably from about 3% to about 10% by weight, based upon the total weight of the composition taken as 100% by weight. The polymer will preferably be present at a level of from about 85% to about 99% by weight, and more preferably from about 90% to about 95% by weight, based upon the total weight of solids in the composition taken as 100% by weight.

The composition of this embodiment will also comprise an acid, such as those selected from the group consisting of p-toluene sulfonic acid, dinonyl naphthalene sulfonic acid, trifluoromethane sulfuric acid, and heptadecafluoro octanesulfonic acid. The acid will preferably be present at a level of from about 1% to about 10% by weight, and more preferably from about to about 7% by weight, based upon the total weight of polymer in the composition taken as 100% by weight.

Blends of a heavy solvent and an etch-resistant polymer are yet another example of suitable shrinkage compositions 24. The etch-resistant polymer can be any polymer with the etch selectivity compared to feature 18 that was described above. Preferred such etch-resistant polymers are silicon-containing polymers.

The heavy solvent remains with the etch-resistant polymer after spin-coating to form a uniform film. The heavy solvent then vaporizes completely during baking (preferably at less than about 120° C., making it suitable for photoresist features 18 as well as non-photoresist features 18), and only the etch-resistant polymer is left to form the conformal coating. "Heavy solvent" refers to those compatible with the etch-resistant polymer and having a boiling point that will allow it to remain after spin-coating but vaporize during the shrinking temperatures described previously. Typical examples of a heavy solvent include those selected from the group consisting of 2-ethyl-2-adamantyl acrylate, 2-methyl-2-adamantyl methacrylate, 2-methyl-adamantyl acrylate, 1-dodecene, and mixtures thereof.

For this type of composition, the solids content of the composition is preferably from about 2% to about 15% by weight, and more preferably from about 3% to about 10% by weight, based upon the total weight of the composition taken as 100% by weight. The polymer will preferably be present at a level of from about 20% to about 80% by weight, and more preferably from about 40% to about 60% by weight, based upon the total weight of solids in the composition taken as 100% by weight.

A further family of materials suitable for the shrinkable composition 24 includes organometallic compounds dispersed or dissolved in a solvent system. The preferred organometallic compounds are those that will release ligands at the previously described shrinkage temperatures to form a metal oxide. This elimination of volatile ligands results in the conformal coating 26. The ligands can be released at low temperatures (e.g., less than about 120° C.), thus making this family of compositions also suitable for use in situations where features 18 are formed from a photoresist composition as well as for features 18 that are formed from a material other than a photoresist composition.

Typical examples include those selected from the group consisting of titanium (IV) bis(ethyl acetoacetato) diisopropoxide, titanium (IV) bis(ammonium lactato) dihydroxide, titanium (IV) diisopropoxide (bis-2,3-pentanedionate), aluminum diisopropoxide ethylacetoacetate, vanadium (IV) oxide bis(2,4-pentane-dionate), zirconium dibutoxide bis(2,4-pentanedionate), aluminum pentanedionate bis(ethylaceto-acetate), hafnium dibutoxide bis(2,4-pentanedionate), vanadium III 2,4-pentanedionate, and poly(dibutyl titanate).

The following shows the ligand release that would occur when using titanium (IV) bis(ethyl acetoacetato) diisopropoxid as the organometallic compound:

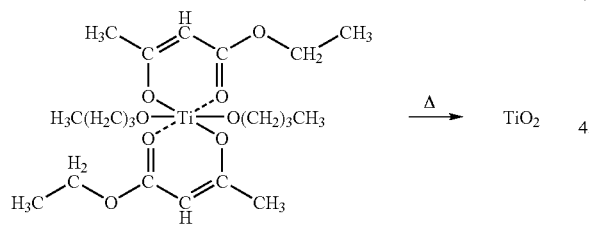

For this type of composition, the solvent system preferably comprises one or more solvents selected from the group consisting of methyl carbinol isobutyl, mesitylene, 1-dodecene, and mixtures thereof. Furthermore, the solids content of the composition is preferably from about 2% to about 15% by weight, and more preferably from about 3% to about 10% by weight, based upon the total weight of the composition taken as 100% by weight. The organometallic compound will preferably be present at a level of from about 40% to about 90% by weight, and more preferably from about 40% to about 80% by weight, based upon the total weight of solids in the composition taken as 100% by weight.

EXAMPLES

The following examples set forth preferred methods in accordance with the invention. It is to be understood, however, that these examples are provided by way of illustration and nothing therein should be taken as a limitation upon the overall scope of the invention.

Example 1

Crosslinker in a Polar Solvent

A solution was made by dissolving 10 grams of Cymel® 303 (a crosslinking agent obtained from Cytec Industries, West Paterson, N.J.) in 90 grams of PGME (obtained from General Chemical West LLC, Hollister, Calif.), a polar solvent. The resulting solution comprised 0.25 wt % of crosslinking agent. Next, 0.025 gram of p-toluene sulfonic acid ("p-TSA," obtained from Sigma-Aldrich, St. Louis, Mo.) was added as a catalyst. The mixture was stirred for 10 minutes and then filtered through a 0.1-μm filter. The formulation was spin-coated onto a flat silicon wafer at 1,500 rpm for 60 seconds, and the film or coating thickness was measured. The wafer was then baked at 205° C. for 60 seconds, with Scheme A depicting the reaction. The coating thickness was measured again in order to obtain the shrinkage. The thickness was reduced by 35% during baking.

Figure 3:
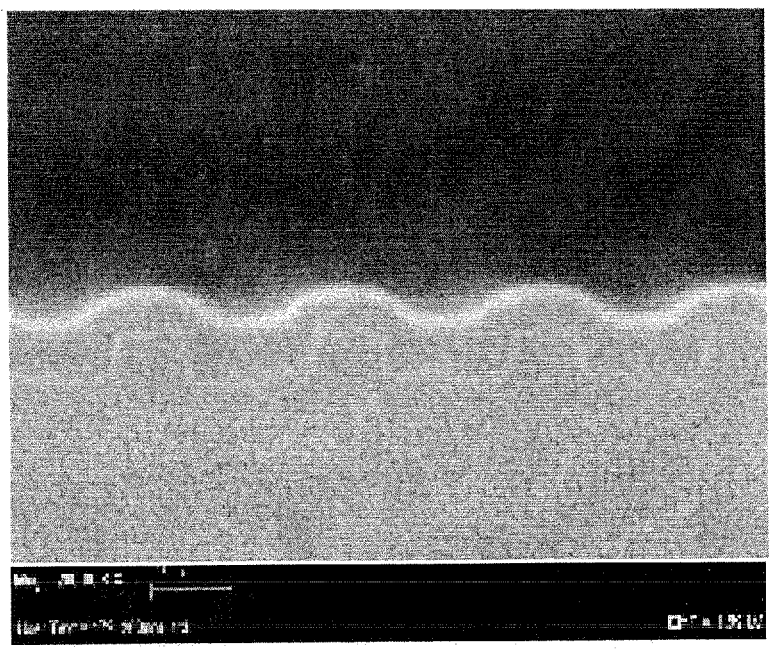
FIG. 3 is a scanning electron microscope (SEM) photograph of the conformal coating prepared in Example 1.

The formulation was also spin-coated onto a wafer with silicon lines at 1,500 rpm for 60 seconds and baked at 205° C. for 60 seconds. FIG. 3 shows the resulting conformal coating on the silicon lines.

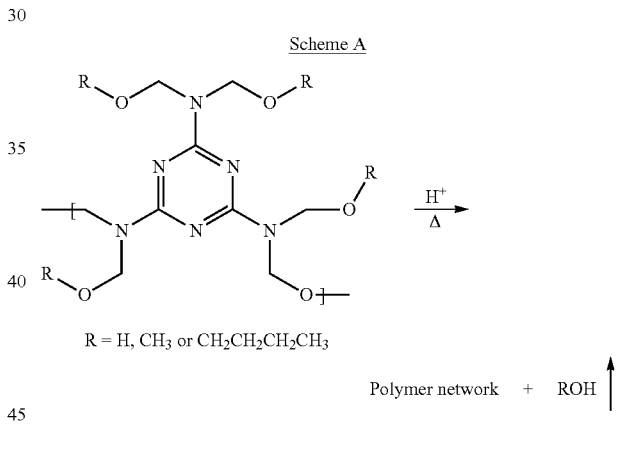

Example 2

Crosslinker in a Nonpolar Solvent

A solution was made by dissolving 10 grams of Cymel® 303 in 90 grams of mesitylene (obtained from Sigma-Aldrich, St. Louis, Mo.), a nonpolar solvent. Next, 0.05 gram of dinonyl naphthalene sulfonic acid solution ("DNNSA," obtained from Sigma-Aldrich, St. Louis, Mo.) was added to obtain a solution that included 0.5 wt % of crosslinking agent. The mixture was stirred for 10 minutes and then filtered through a 0.1-μm filter.

The formulation was spin-coated onto a flat silicon wafer at 1,500 rpm for 60 seconds, and the coating thickness was measured. The wafer was then baked at 205° C. for 60 seconds, and the coating thickness was measured to determine coating shrinkage. The coating thickness was reduced by 35% during baking.

Figure 4:
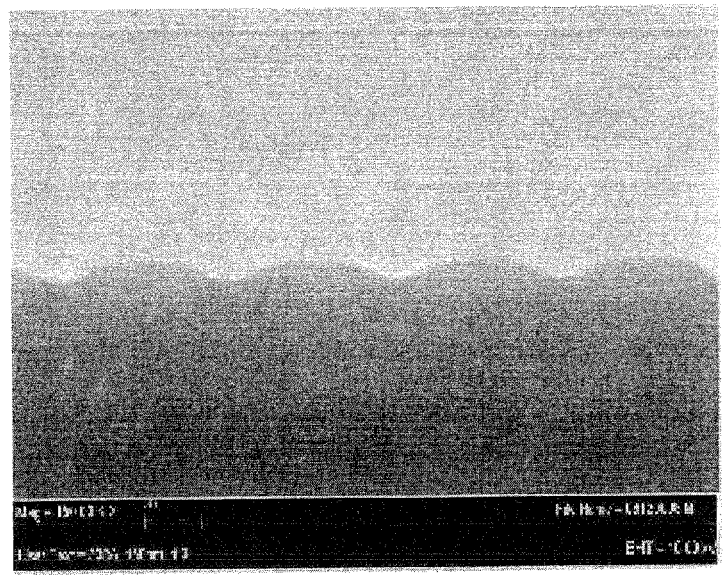
FIG. 4 is an SEM photograph showing the conformal coating prepared in Example 2.

The formulation was also spin-coated onto a wafer with silicon lines at 1,500 rpm for 60 seconds and was then baked at 205° C. for 60 seconds. FIG. 4 shows the resulting conformal coating made from this formulation on the silicon lines wafer.

Example 3

Poly(Adamantate EA)

In this procedure, 10 grams (40 wt %) Adamantate EA (2-ethyl-2-adamantyl acrylate; obtained from Idemitsu Kosan Co., Ltd., Chiba, Japan) and 0.1 gram (1 wt % of Adamantate EA) of azobisisobutyronitrile ("AIBN," an initiator obtained from Sigma-Aldrich, St. Louis, Mo.) were dissolved in 15 grams of mesitylene. Polymerization was performed at 100° C. for 24 hours, after which the solution was diluted to 7.5 wt % using mesitylene. Next, 0.05 gram of DNNSA (0.5 wt % of polymer) was added to the polymer solution. The mixture was stirred for 10 minutes and filtered through a 0.1-μm filter. The formulation was spin-coated onto a flat silicon wafer at 1,500 rpm for 60 seconds and the coating thickness was measured. The wafer was then baked at 110° C. for 60 seconds, and the thickness of the coating was measured again to obtain shrinkage data. The coating thickness was reduced by 70% during baking. Scheme B provides a depiction of the volatile release during baking.

Figure 5:
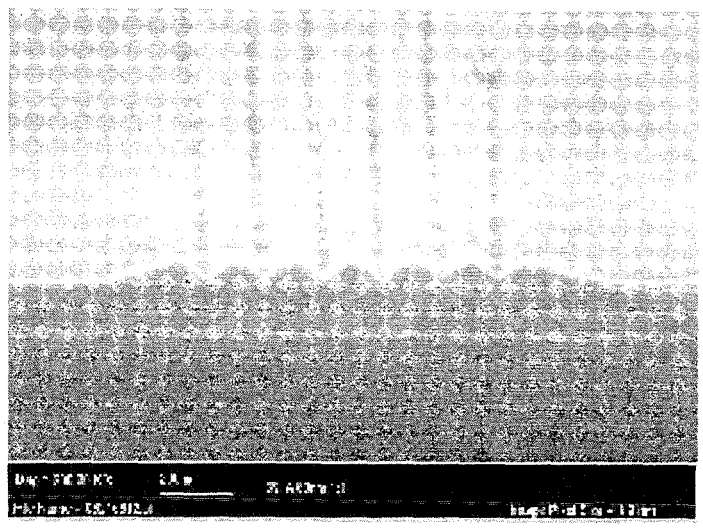
FIG. 5 is an SEM photograph of the conformal coating prepared in Example 3.

The formulation was also spin-coated onto a photoresist-patterned wafer at 1,500 rpm for 60 seconds and baked at 90° C. for 60 seconds. FIG. 5 shows the resulting conformal coating on top of the photoresist lines.

Scheme B

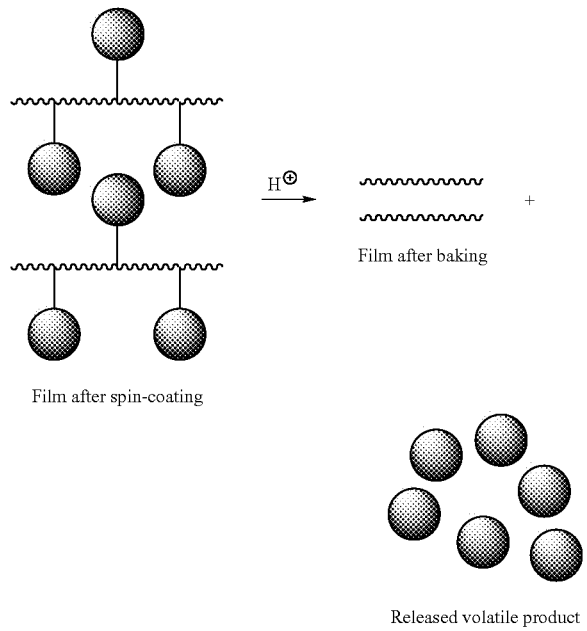

Example 4

Poly(Adamantate EA—Silicone)

A solution was made by dissolving 8 grams (32 wt %) of Adamantate EA and 2 grams (8 wt %) of a silicone methacrylate monomer (3-(methacryloyloxy)propyl-tris(trimethylsilyloxy)-silane, obtained from TCI America, Portland, Oreg.) in 15 grams of mesitylene. Polymerization was performed at 100° C. for 24 hours. The solution was diluted to 7.5 wt % using 108.3 grams of mesitylene, and 0.05 gram of DNNSA (which was 0.5 wt % of polymer) was then added to the solution. The mixture was stirred for 10 minutes and filtered through a 0.1-μm filter. A flat silicon wafer was spin-coated at 1,500 rpm for 60 seconds, and the coating thickness was measured. The wafer was then baked at 110° C. for 60 seconds, and the thickness of the coating was measured again in order to obtain shrinkage data. The coating thickness was reduced by 55% during baking.

Figure 6:
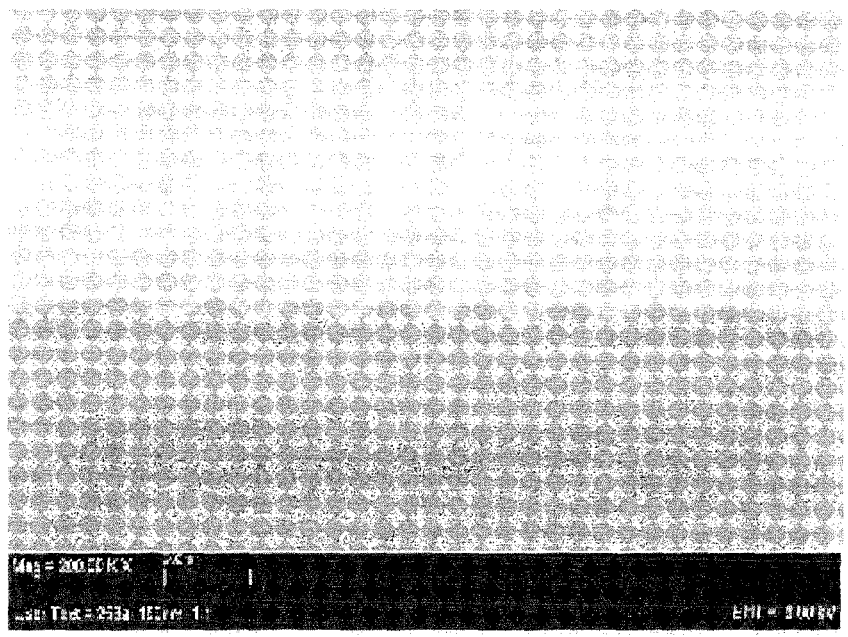
FIG. 6 is an SEM photograph showing the conformal coating prepared in Example 4.

The formulation was also spin-coated onto a photoresist-patterned wafer at 1,500 rpm for 60 seconds and baked at 90° C. for 60 seconds. FIG. 6 shows the resulting conformal coating on top of photoresist lines.

The etch rates of the coating in different gases were measured using Oxford Plasmalab RIE under the following conditions: power—100 W; pressure—50 mTorr; backside Helium—3 mTorr; and gas—50 sccm. The etch selectivities of the coating compared to a commercially available photoresist (AR1682J, obtained from JSR Micro, Sunnyvale, Calif.) and to a thermal oxide layer after 30 seconds of etching are listed in Table 1.

TABLE 1

| | GAS | | |
|---|---|---|---|
| | $O_2$ | $CF_4$ | $Cl_2$ |
| AR1682J | 0.25 | 1.2 | 1.4 |
| Thermal Oxide | — | 2.4 | — |

Example 5

Poly(Adamantate EA—Silicone)

A solution was made by dissolving 8 grams (32 wt %) of Adamantate EA and 2 grams (8 wt %) of a silicone methacrylate monomer (MCR-M07, monomethacrylate-terminated polydimethylsiloxane; molecular weight: 600-800 g/mol; obtained from Gelest Inc, Morrisville, Pa.) in 15 grams of mesitylene. Polymerization was performed at 80° C. for 24 hours. The solution was diluted to 7.5 wt % using 108.3 grams of methyl isobutyl carbinol (obtained from Sigma-Aldrich, St. Louis, Mo.), and 0.05 gram of DNNSA (0.5 wt % of polymer) was then added to the solution. The mixture was stirred for 10 minutes and was then filtered through a 0.1-μm filter. A flat silicon wafer was spin-coated at 1,500 rpm for 60 seconds, and the thickness of the coating was measured. The coating was then baked at 110° C. for 60 seconds, and the thickness of the coating was measured again in order to obtain shrinkage data. The coating thickness was reduced by 55% during baking.

The etch rates in different gases were measured using an Oxford Plasmalab RIE under the following conditions: power—100 W; pressure—50 mTorr; backside Helium—3 mTorr; gas—50 sccm. The etch selectivities of the coating compared to a commercially available photoresist (AR1682J) and to a the thermal oxide layer after 30 seconds of etching are listed in Table 2.

TABLE 2

| | GAS | | |
|---|---|---|---|
| | $O_2$ | $CF_4$ | $Cl_2$ |
| AR1682J | 0.10 | 1.2 | 1.4 |
| Thermal Oxide | — | 2.4 | — |

Figure 7A:
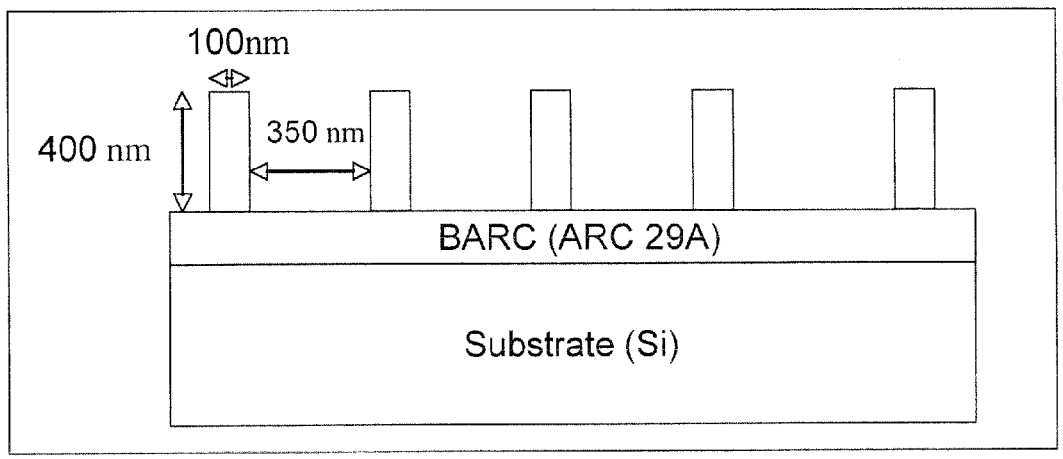
FIG. 7(a) is a schematic illustration of the template stack used in Example 5.
Figure 7B:
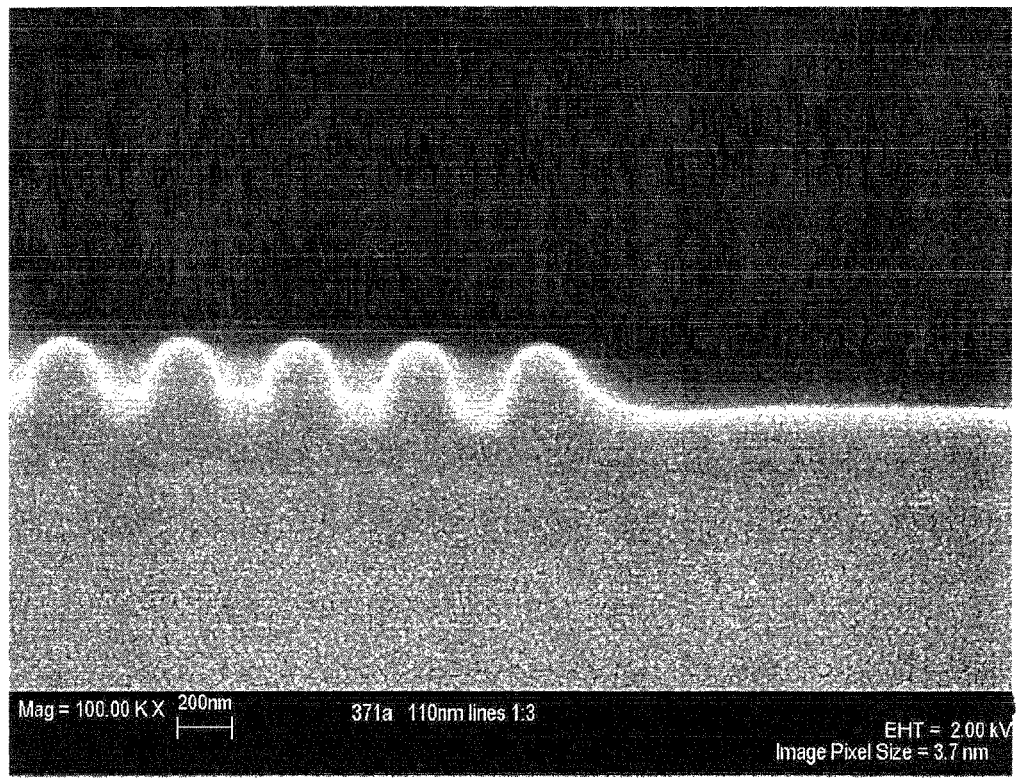
FIG. 7(b) is an SEM photograph of the conformal coating prepared in Example 5.

A resist-patterned wafer was used as a template, as schematically depicted in FIG. 7(a). An organic bottom antireflective coating (ARC® 29A, obtained from Brewer Science Inc, Rolla, Mo.) was used as the layer between the patterned photoresist and the substrate. The above formulation was spin-coated onto the photoresist-patterned wafer at 1,000 rpm for 60 seconds and then baked at 90° C. for 60 seconds. FIG. 7(b) shows the resulting conformal coating on the top of the photoresist lines.

Figure 7C:
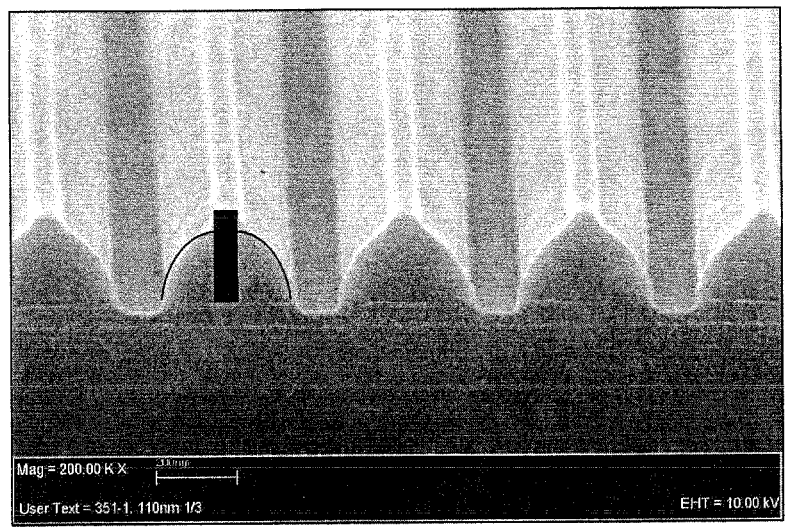
FIG. 7(c) is an SEM photograph of the sidewalls that were formed after etching the structure in Example 5.
Figure 7D:
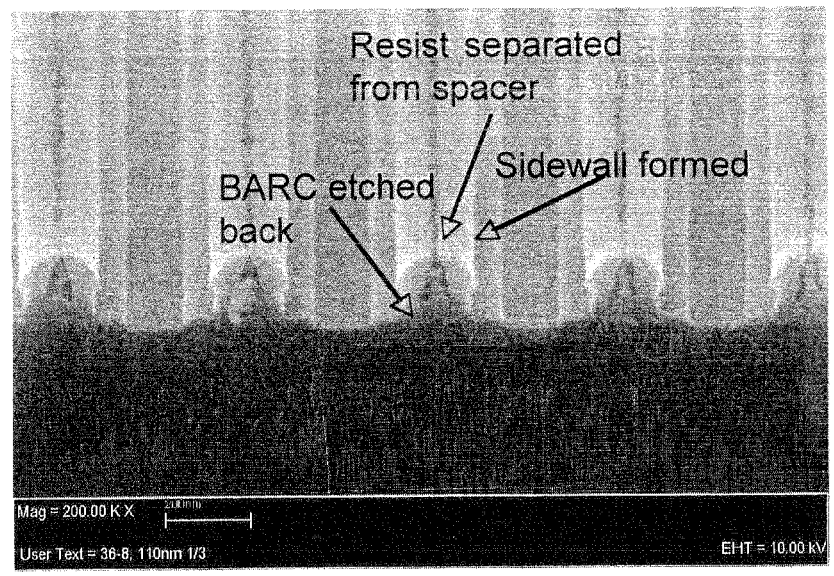
FIG. 7(d) is an SEM photograph showing the collapsing that occurred after further etching to remove the photoresist of the structure of Example 5.

The coated wafer was then etched using chlorine gas ($Cl_2$—50 sccm; Argon—20 sccm; power—200 W; and pressure: 50 mTorr), and FIG. 7(c) shows the sidewall formation. The wafer was further etched using oxygen ($O_2$—50 sccm; power—100 W; pressure—100 mTorr) to remove the resist. However, the spacers collapsed due to the use of an organic bottom anti-reflective coating as the bottom layer, which etched in oxygen much faster than the spacers (FIG. 7(d)).

Figure 8A:
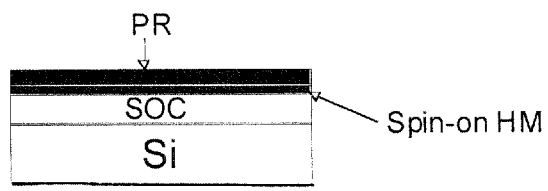
FIG. 8(a) is a schematic illustration of an alternative template stack used in Example 5 in order to prevent pattern collapse.

To address the collapse problem, a new template was prepared with the stacking of layers as shown in FIG. 8(a). Specifically, a bottom layer of OptiStack SOC 110 (a spin-on carbon or "SOC," obtained from Brewer Science Brewer Science Inc, Rolla, Mo.) was applied to a silicon wafer. Next, a silicon-containing bottom anti-reflective coating OPTISTACK® HM710 (a hard mask or "HM," obtained from Brewer Science Inc, Rolla, Mo.), was applied on the top of spin-on carbon. A photoresist layer (Pi6001, obtained from TOK, Japan) was formed on top of the hard mask layer, followed by patterning to form lines.

Figure 8B:
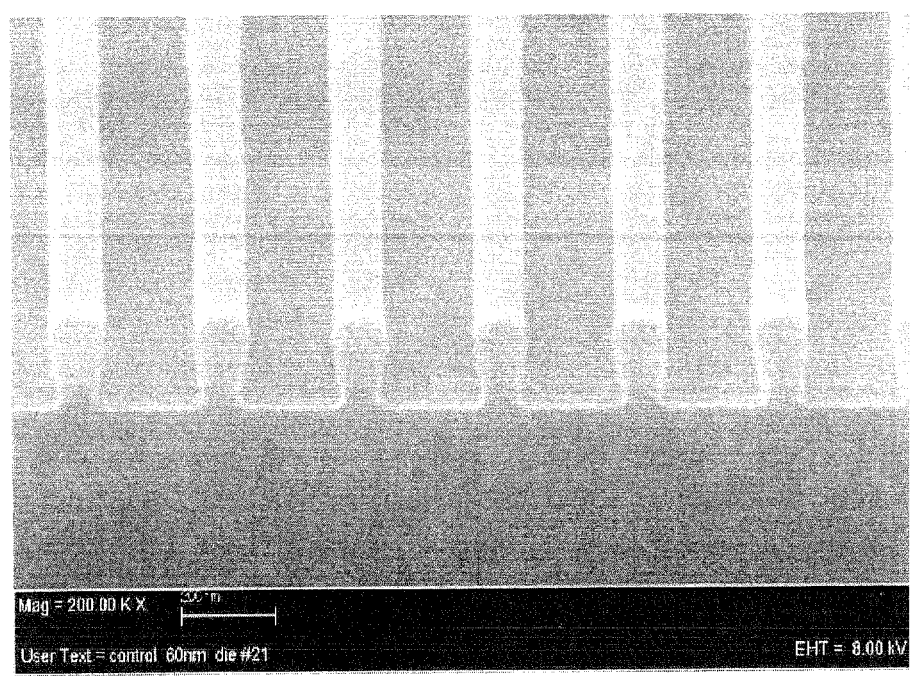
FIG. 8(b) is an SEM photograph of the coating prepared in Example 5.
Figure 8C:
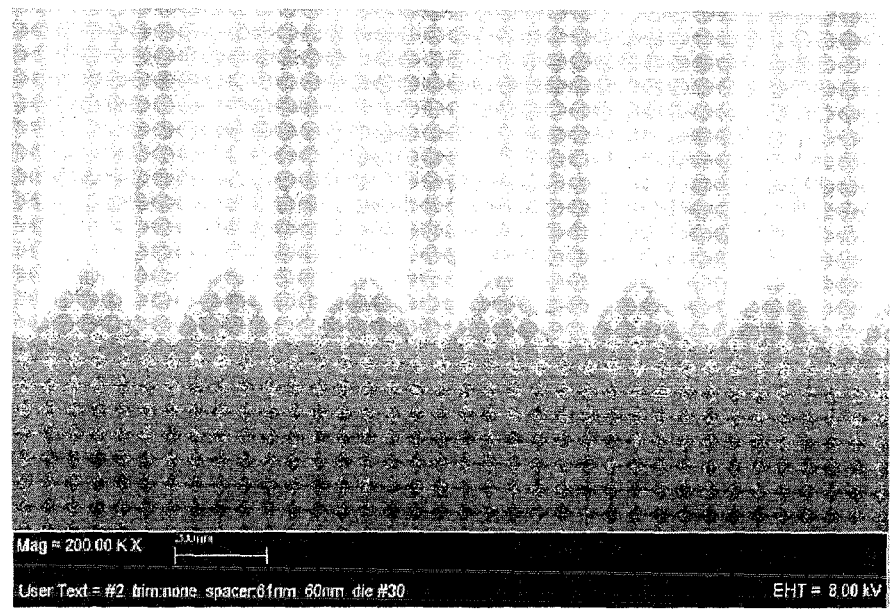
FIG. 8(c) is an SEM photograph of the sidewalls that were formed after etching the alternative structure in Example 5.

The above formulation was spin-coated onto the photoresist-patterned wafer at 2,000 rpm for 60 seconds, followed by baking at 90° C. for 60 seconds (see FIG. 8(b)). The coated wafer was etched using chlorine gas ($Cl_2$—50 sccm; Argon—20 sccm; power—200 W; pressure—50 mTorr). FIG. 8(c) shows sidewall formation.

Figure 8D:
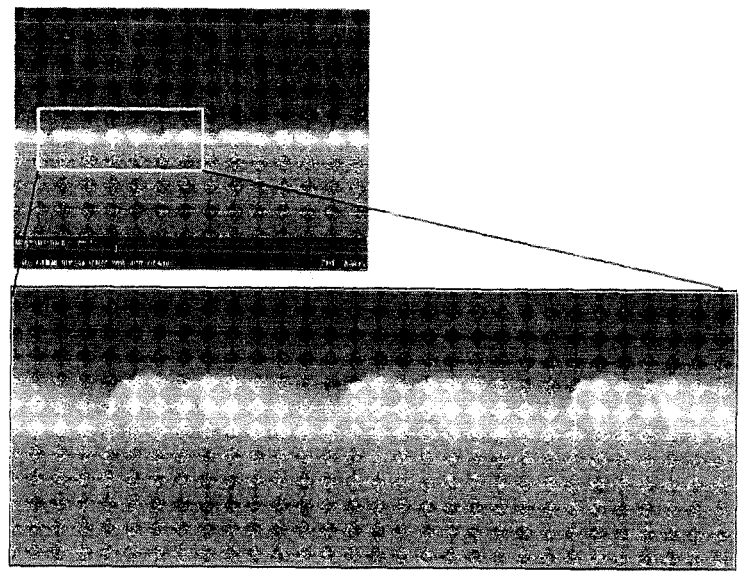
FIG. 8(d) is an SEM photograph showing the alternative structure of Example 5 after further etching to remove the photoresist.
Figure 8E:
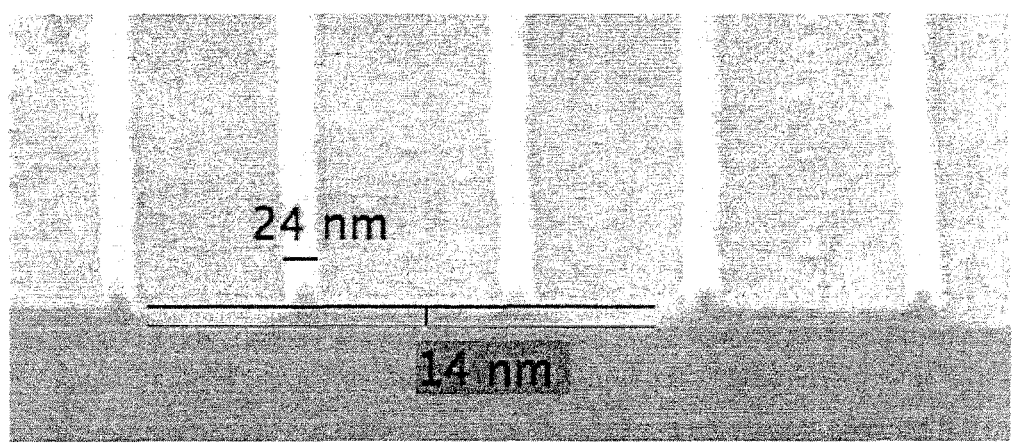
FIG. 8(e) is an SEM photograph showing the alternative structure of Example 5 after further etching to transfer the pattern to the hard mask layer.

The wafer was further etched by oxygen to remove the photoresist ($O_2$—50 sccm; power—100 W; pressure—100 mTorr). FIG. 8(d) shows the standing spacer after resist removal. $CF_4$ etching ($CF_4$—35 sccm; power—100 W; pressure—50 mTorr) was used to transfer the pattern to the bottom hardmask layer FIG. 8(e).

Example 6

Blend of Adamantate EM and Organic Silicone Copolymer

A solution was made by dissolving 9 grams (36 wt %) of a silicone methacrylate monomer (3-(methacryloyloxy) propyltris (trimethylsilyloxy) silane, obtained from TCI America, Portland, Oreg.), 1 gram (4 wt % of the solution) of glycidyl methacrylate, and 0.1 grain (1 wt % of monomers) of AIBN in 15 grams of mesitylene. Polymerization was performed at 100° C. for 24 hours, and the solution was used without further purification.

A solution of mesitylene and the above polymer (6 wt %) and 23.3 grams (14 wt %) of 2-ethyl-2-adamantyl methacrylate (sold under the name Adamantate EM by Idemitsu Kosan Co., Ltd., Chiba, Japan) was prepared. The mixture was stirred for 10 minutes and filtered through a 0.1-μm filter. The mixture was spin-coated on a flat silicon wafer at 1,500 rpm for 60 seconds, and the coating thickness was measured. The coating was then baked at 110° C. for 60 seconds, and the thickness of the coating was measured again in order to obtain shrinkage data. The coating thickness was reduced by 70% during baking.

Example 7

Organometallic Compound

Titanium (IV) bis(ethyl acetoacetato) diisopropoxide (0.5 g, obtained from Sigma-Aldrich, St. Louis, Mo.) was dissolved in 9.5 g methyl isobutyl carbinol. The mixture was stirred for 10 minutes and filtered through a 0.1-μm filter. The mixture was spin-coated onto a flat silicon wafer at 1,500 rpm for 60 seconds, the coating thickness was measured. The coating was then baked at 110° C. for 60 seconds, and the thickness of the coating was measured again in order to obtain shrinkage data. The coating thickness was reduced by 80% during baking.

We claim:

1. A method of forming a microelectronic structure, said method comprising:
   providing a precursor structure having a patterned surface, said patterned surface including at least one raised feature having first and second sidewalls and an upper surface, wherein said precursor structure further comprises a second raised feature that is below said at least one raised feature, said second raised feature having first and second sidewalls and an upper surface and said at least one raised feature being in contact with said second raised feature sidewalls and upper surface, said second raised feature and said at least one raised feature being formed of different materials;
   spin-applying a shrinkable composition to said patterned surface, said composition having an initial thickness and covering said at least one raised feature having said first and second sidewalls and said upper surface;
   heating said shrinkable composition, wherein said composition shrinks by at least about 25% so as to form a conformal layer of said composition on said patterned surface and over said at least one raised feature, said conformal layer having a final thickness that is at least about 25% less than said initial thickness; and
   removing at least some of said conformal layer to yield a pre-spacer structure comprising said at least one raised feature and remnants of said conformal layer against said at least one raised feature first and second sidewalls.

2. The method of claim 1, further comprising removing said at least one raised feature from said pre-spacer structure so as to leave said remnants on said patterned surface.

3. The method of claim 2, wherein said patterned surface has a first pattern comprising said at least one raised feature prior to said applying and a second pattern after removing said at least one raised feature, said second pattern comprising said remnants and being double that of the first pattern.

4. The method of claim 2, there being one or more layers below said patterned surface and further comprising transferring the pattern created by said remnants down to one or more of said layers below said patterned surface.

5. The method of claim 1, said patterned surface including at least two of said raised features immediately adjacent one another, wherein after said heating there is a maximum thickness A of said conformal layer on the upper surface of each feature and a minimum thickness B on said patterned surface at a point between said two raised features, and B is less than or equal to A.

6. The method of claim 1, wherein said precursor structure comprises:
   a first layer having an upper surface;
   a second layer having an upper surface, said second layer being adjacent said first layer upper surface; and
   said patterned surface being adjacent said second layer upper surface.

7. The method of claim 6, said first layer comprising a spin-on carbon layer, said second layer comprising a hard mask layer, and said patterned surface comprising a photosensitive layer.

8. The method of claim 1, said patterned surface having a plurality of said raised features at a pitch of from about 1:2 to about 1:4.

9. The method of claim 1, further comprising removing said at least one raised feature from said pre-spacer structure so as to leave said remnants and said second raised feature on said patterned surface.

10. The method of claim 9, wherein said patterned surface has a first pattern comprising said at least one raised feature prior to said applying and a second pattern after removing said at least one raised feature, said second pattern comprising said remnants and said second raised feature and being triple that of the first pattern.

11. The method of claim 1, wherein said shrinkable composition is selected from the group consisting of:
   (a) a composition comprising a crosslinking agent dispersed or dissolved in a solvent system;
   (b) a composition comprising a polymer dispersed or dissolved in a solvent system, said polymer comprising acid-labile side chains;
   (c) a composition comprising a polymer resistant to $O_2$, $Cl_2$, $CF_4$, $CH_3F$, or $CHF_3$ etchants, said polymer being dispersed or dissolved in a solvent system comprising a heavy solvent; and
   (d) a composition comprising an organometallic compound dissolved or dispersed in a solvent system.

12. The method of claim 11, wherein said shrinkable composition is (a), and said crosslinking agent is selected from the group consisting of poly(melamine-co-formaldehyde) methylated, poly(melamine-co-formaldehyde) butylate, poly(melamine-co-formaldehyde) isobutylate, hexamethylmelamine, glycolurils, 1,3-bis(methoxymethyl)-4,5-bis (methoxy)-ethylenurea, 1,3-bis(methoxymethyl) urea, and the following derivatives:

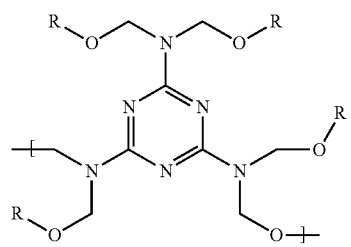

R = H, $C_xH_{2x+2}$, X = 1~12

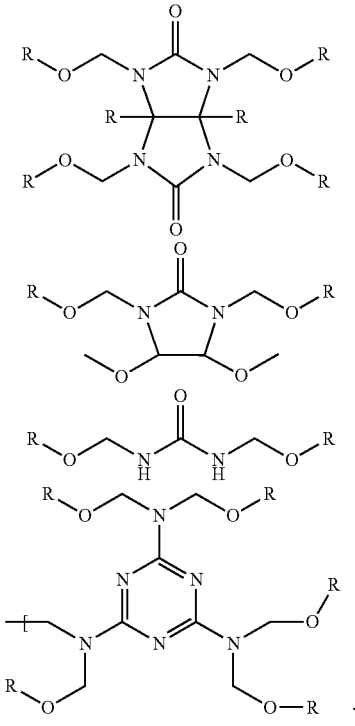

R = $C_xH_{2x+2}$, X = 1~12

13. The method of claim 11, wherein said shrinkable composition is (b), and said polymer comprises monomers selected from the group consisting of styrenes, methyl acrylates, and acrylates, and said acid-labile side chain is selected from the group consisting of t-butyl, acetyls, adamantyls, and lactones.

14. The method of claim 11, wherein:
   said shrinkable composition is (c);
   said polymer has an etch selectivity compared to that of said at least one raised feature of less than about 0.30 when $O_2$ is used as an etchant; and
   said heavy solvent is selected from the group consisting of 2-ethyl-2-adamantyl acrylate, 2-methyl-2-adamantyl methacrylate, 2-methyl-adamantyl acrylate, 1-dodecene, and mixtures thereof.

15. The method of claim 11, wherein said shrinkable composition is (d), and said organometallic compound is selected from the group consisting of titanium (IV) bis(ethyl acetoacetato) diisopropoxide, titanium (IV) bis(ammonium lactato) dihydroxide, titanium (IV) diisopropoxide (bis-2,3-pentanedionate), aluminum diisopropoxide ethylacetoacetate, vanadium (IV) oxide bis(2,4-pentane-dionate), zirconium dibutoxide bis(2,4-pentane-dionate), aluminum pentanedionate bis(ethylacetoacetate), hafnium dibutoxide bis(2,4-pentanedionate), vanadium III 2,4-pentanedionate, and poly(dibutyl titanate).

16. The method of claim 1, wherein said heating comprises heating at a temperature of less than about 300° C.

17. The method of claim 16, wherein said heating comprises heating at a temperature of less than about 120° C.

18. The method of claim 17, wherein said patterned surface comprises a photosensitive layer, and said shrinkable composition comprises a solvent selected from the group consisting of mesitylene, methyl isobutyl carbinol, d-limonene, and mixtures thereof.

19. A method of forming a microelectronic structure, said method comprising:
  providing a precursor structure comprising:
    a first layer comprising a spin-on carbon layer and having an upper surface;
    a second layer comprising a hard mask layer and having an upper surface, said second layer being adjacent said first layer upper surface;
    a patterned surface adjacent said second layer upper surface, said patterned surface comprising a photosensitive layer and including at least one raised feature having first and second sidewalls and an upper surface; and
    a second raised feature that is below said at least one raised feature, said second raised feature having first and second sidewalls and an upper surface and said at least one raised feature being in contact with said second raised feature sidewalls and upper surface, said second raised feature and said at least one raised feature being formed of different materials;
  applying a shrinkable composition to said patterned surface, said composition having an initial thickness and covering said at least one raised feature having said first and second sidewalls and said upper surface;
  heating said shrinkable composition, wherein said composition shrinks by at least about 25% so as to form a conformal layer of said composition on said patterned surface and over said at least one raised feature, said conformal layer having a final thickness that is at least about 25% less than said initial thickness; and
  removing at least some of said conformal layer to yield a pre-spacer structure comprising said at least one raised feature and remnants of said conformal layer against said at least one raised feature first and second sidewalls.

* * * * *